(12) United States Patent
Hirata et al.

(10) Patent No.: US 10,654,710 B2
(45) Date of Patent: May 19, 2020

(54) SEMICONDUCTOR APPARATUS HAVING FLEXIBLE CONNECTING MEMBERS AND METHOD FOR MANUFACTURING THE SAME

(71) Applicant: Mitsubishi Electric Corporation, Chiyoda-ku (JP)

(72) Inventors: Yoshiaki Hirata, Chiyoda-ku (JP); Nobuaki Konno, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 16/092,865

(22) PCT Filed: Jan. 25, 2017

(86) PCT No.: PCT/JP2017/002532
§ 371 (c)(1),
(2) Date: Oct. 11, 2018

(87) PCT Pub. No.: WO2017/203746
PCT Pub. Date: Nov. 30, 2017

(65) Prior Publication Data
US 2019/0127215 A1    May 2, 2019

(30) Foreign Application Priority Data

May 25, 2016    (JP) .................................. 2016-104362

(51) Int. Cl.
*B81B 7/00*    (2006.01)
*B81C 1/00*    (2006.01)
(Continued)

(52) U.S. Cl.
CPC .......... *B81B 7/007* (2013.01); *B81C 1/00301* (2013.01); *H01L 23/04* (2013.01);
(Continued)

(58) Field of Classification Search
CPC ..... B81B 7/007; B81C 7/00301; H01L 24/72; H01L 24/90
See application file for complete search history.

(56) References Cited

U.S. PATENT DOCUMENTS 7,554,136 B2 * 6/2009 Takayanagi ............. B81B 7/007
257/254
7,897,503 B2 * 3/2011 Foster ................... B81B 7/0006
438/618
(Continued)

FOREIGN PATENT DOCUMENTS

JP       2-218143 A     8/1990
JP       2010-37165 A   2/2010
(Continued)

OTHER PUBLICATIONS

Extended European Search Report dated May 21, 2019 in European Patent Application No. 17802348.7 citing documents AA and AX therein, 7 pages.

(Continued)

*Primary Examiner* — Ida M Soward
(74) *Attorney, Agent, or Firm* — Oblon, McClelland, Maier & Neustadt, L.L.P.

(57) ABSTRACT

A semiconductor apparatus includes a first substrate having a first surface, a semiconductor device, a first flexible connecting member electrically connected to the semiconductor device, a first pad connected to the first flexible connecting member, and a second substrate including a bump and an interconnect. The second substrate is a low-temperature sintered ceramic substrate containing alkali metal ions. The first pad is connected to the interconnect via the bump. The first pad has at least a portion overlapping the semiconductor device in a plan view seen in a direction (Continued)

along a normal to the first surface. The semiconductor apparatus can thus be miniaturized.

20 Claims, 17 Drawing Sheets

(51) Int. Cl.
H01L 23/04 (2006.01)
H01L 23/08 (2006.01)
H01L 23/48 (2006.01)
H01L 23/00 (2006.01)

(52) U.S. Cl.
CPC .............. *H01L 23/08* (2013.01); *H01L 23/48* (2013.01); *H01L 24/72* (2013.01); *H01L 24/90* (2013.01); *B81B 2207/07* (2013.01); *B81B 2207/095* (2013.01); *B81C 2203/0118* (2013.01); *B81C 2203/031* (2013.01); *B81C 2203/035* (2013.01)

(56) References Cited

U.S. PATENT DOCUMENTS

| | | | | |
|---|---|---|---|---|
| 8,283,738 B2* | 10/2012 | Fujii | ...................... | B81B 7/007 257/414 |
| 8,322,829 B2* | 12/2012 | Sakuma | ................ | B41J 2/1404 347/68 |
| 8,695,186 B2* | 4/2014 | Sugiyama | ............ | H03H 9/1021 156/272.2 |
| 9,383,383 B2* | 7/2016 | Tanaka | .................. | G01P 15/125 |
| 9,955,246 B2* | 4/2018 | Reese | ..................... | H04R 19/04 |
| 9,975,762 B2* | 5/2018 | Chu | ..................... | B81C 1/00238 |
| 10,026,719 B2* | 7/2018 | Khalifa | ................. | H01L 25/105 |
| 2006/0244118 A1* | 11/2006 | Roberts | ................ | G02B 3/0056 257/686 |
| 2011/0108931 A1 | 5/2011 | Mohri et al. | | |
| 2011/0230068 A1 | 9/2011 | Pahl | | |
| 2014/0374912 A1 | 12/2014 | Knights | | |
| 2015/0114118 A1* | 4/2015 | Che | ....................... | G01P 15/125 73/514.32 |

FOREIGN PATENT DOCUMENTS

| | | |
|---|---|---|
| JP | 2013-30759 A | 2/2013 |
| JP | 2015-8288 A | 1/2015 |
| JP | 2016-4848 A | 1/2016 |
| WO | WO 2010/016598 A1 | 2/2010 |

OTHER PUBLICATIONS

Rusu, C. et al., "LTCC interconnects in microsystems", Journal of Micromechanics and Microengineering, Institute of Physics Publishing, XP020105012, vol. 16, No. 6, 2006, pp. S13-S18.

International Search Report dated Mar. 21, 2017 in PCT/JP2017/002532 filed Jan. 25, 2017.

* cited by examiner

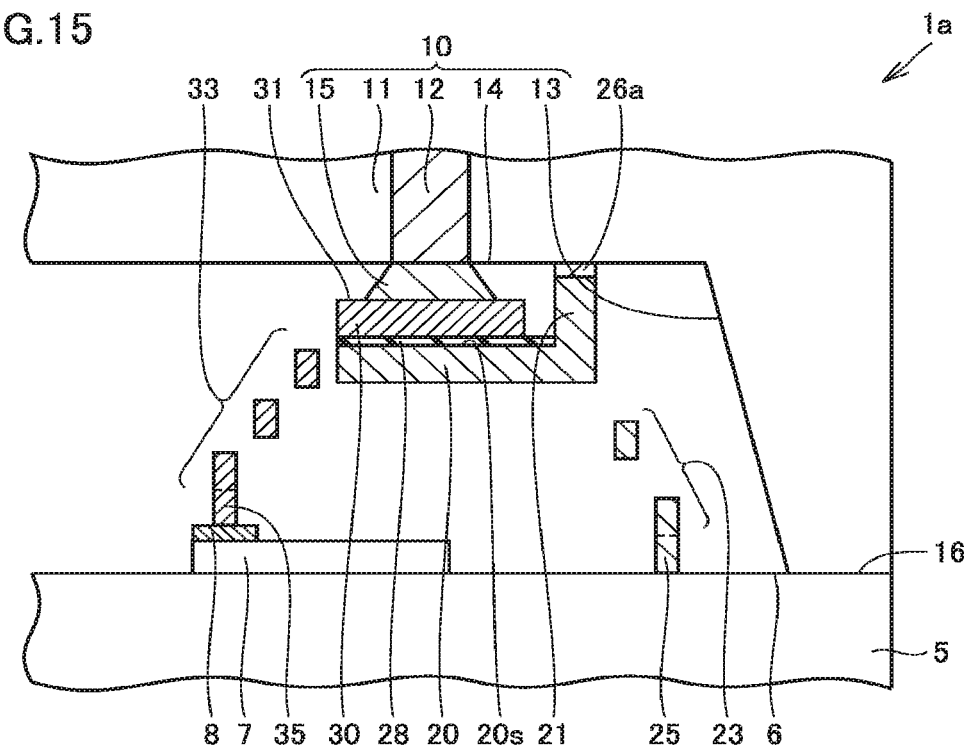
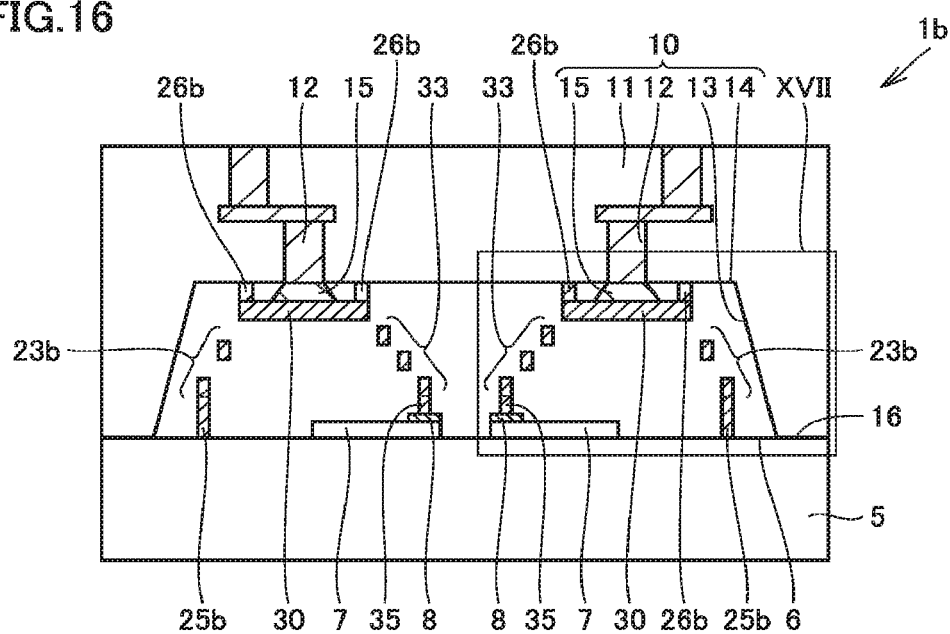

SEMICONDUCTOR APPARATUS HAVING FLEXIBLE CONNECTING MEMBERS AND METHOD FOR MANUFACTURING THE SAME

TECHNICAL FIELD

The present invention relates to a semiconductor apparatus and a method for manufacturing the same.

BACKGROUND ART

There is known a packaged device which is a device, such as an electronic circuit or microelectromechanical system (MEMS) formed on a device substrate and sealed by the device substrate and a low-temperature co-fired ceramic (LTCC) substrate (see Patent Document 1). In the packaged device described in Patent Document 1, the LTCC substrate includes an interconnect such as a via interconnect, and a bump integrated with the interconnect. The bump is bonded to a pad electrically connected to the device.

CITATION LIST

Patent Document

PTD 1: Japanese Patent Laying-Open No. 2013-30759

SUMMARY OF INVENTION

Technical Problem

A method for producing an LTCC substrate including an interconnect and a bump typically comprises the following steps: A plurality of green sheets are produced. The plurality of green sheets are provided with through holes. A method such as screen printing is used to form an interconnect such as a via interconnect in the plurality of green sheets. The plurality of green sheets with the interconnect formed therein are stacked. The plurality of green sheets are fired to produce the LTCC substrate. On the LTCC substrate, a bump integrated with the interconnect is formed.

When the plurality of green sheets are fired, the plurality of green sheets shrink. For this reason, the interconnect formed in the LTCC substrate and the bump formed on the LTCC substrate have a low positional accuracy of 100 μm or more. It is necessary to increase the size of the pad to ensure that the bump is bonded to the pad even if the position of the interconnect and bump is changed by 100 μm or more. Furthermore, the pad needs to be placed on a periphery of an upper surface of the electronic circuit or MEMS or on the device substrate around the electronic circuit or MEMS to prevent the pad from preventing the operation of the electronic circuit or MEMS. The LTCC substrate with an interconnect and a bump having low positional accuracy entailing an increase in size of a pad, and a limitation on where the pad bonded to the bump is displaced invite an increased size of the packaged device described in PTD 1.

The present invention has been made in view of the above problem, and an object thereof is to provide a semiconductor apparatus which can be miniaturized and a method for manufacturing the same.

Solution to Problem

A semiconductor apparatus of the present invention comprises: a first substrate having a first surface; a semiconductor device provided on and/or in the first surface; a first flexible connecting member electrically connected to the semiconductor device; a first pad electrically and mechanically connected to the first flexible connecting member; and a second substrate having a second surface facing the first surface of the first substrate, and covering the semiconductor device, The second substrate includes a bump protruding from the second surface, and an interconnect electrically connected to the bump. The second substrate is a low-temperature sintered ceramic substrate containing alkali metal ions. The first pad is electrically connected and mechanically bonded to the interconnect via the bump. The first pad has at least a portion overlapping the semiconductor device in a plan view seen in a direction along a normal to the first surface. The bump has at least a portion overlapping the first pad in the plan view seen in the direction along the normal to the first surface.

A method for manufacturing a semiconductor apparatus according to the present invention comprises: providing a semiconductor device on and/or in a first surface of a first substrate; forming a first flexible connecting member electrically connected to the semiconductor device; forming above the first surface of the first substrate a first pad electrically and mechanically connected to the first flexible connecting member; and disposing a second substrate including a bump and an interconnect electrically connected to the bump so as to cover the semiconductor device. The forming the first pad includes forming the first pad to have at least a portion overlapping the semiconductor device in a plan view seen in a direction along a normal to the first surface. The disposing the second substrate includes disposing the second substrate to allow a second surface of the second substrate with the bump protruding from the second surface to face the first surface of the first substrate and the bump to have at least a portion overlapping the first pad in the plan view seen in the direction along the normal to the first surface. The second substrate is a low-temperature sintered ceramic substrate containing alkali metal ions. The method for manufacturing a semiconductor apparatus according to the present invention further comprises applying heat and a first voltage to the second substrate to move the first pad toward the second surface to electrically connect and mechanically bond the first pad to the interconnect via the bump.

Advantageous Effects of Invention

In the semiconductor apparatus of the present invention, the first pad is electrically and mechanically connected to the first flexible connecting member. This allows the first pad and the bump to be disposed to allow the first pad to have at least a portion overlapping the semiconductor device and the bump to have at least a portion overlapping the first pad in the plan view seen in the direction along the normal to the first surface without preventing the semiconductor device from operating. The semiconductor apparatus of the present invention can be miniaturized even if the first pad is increased in size due to low positional accuracy of the interconnect and the bump of the second substrate that is a low-temperature co-fired ceramic (LTCC) substrate.

The method for manufacturing a semiconductor apparatus according to the present invention comprises forming a first pad electrically and mechanically connected to a first flexible connecting member. This allows the first pad and the bump to be disposed to allow the first pad to have at least a portion overlapping the semiconductor device and the bump to have at least a portion overlapping the first pad in the plan view seen in the direction along the normal to the first surface without preventing the semiconductor device from operating. The method for manufacturing a semiconductor apparatus according to the present invention allows the semiconductor apparatus to be miniaturized even if the first pad is increased in size due to low positional accuracy of the interconnect and the bump of the second substrate that is a low-temperature co-fired ceramic (LTCC) substrate.

BRIEF DESCRIPTION OF DRAWINGS

FIG. 15 is a schematic partial enlarged cross section of a semiconductor apparatus according to a modification of the first embodiment of the present invention.

FIG. 16 is a schematic cross section of a semiconductor apparatus according to the second embodiment of the present invention.

DESCRIPTION OF EMBODIMENTS

Figure 1:
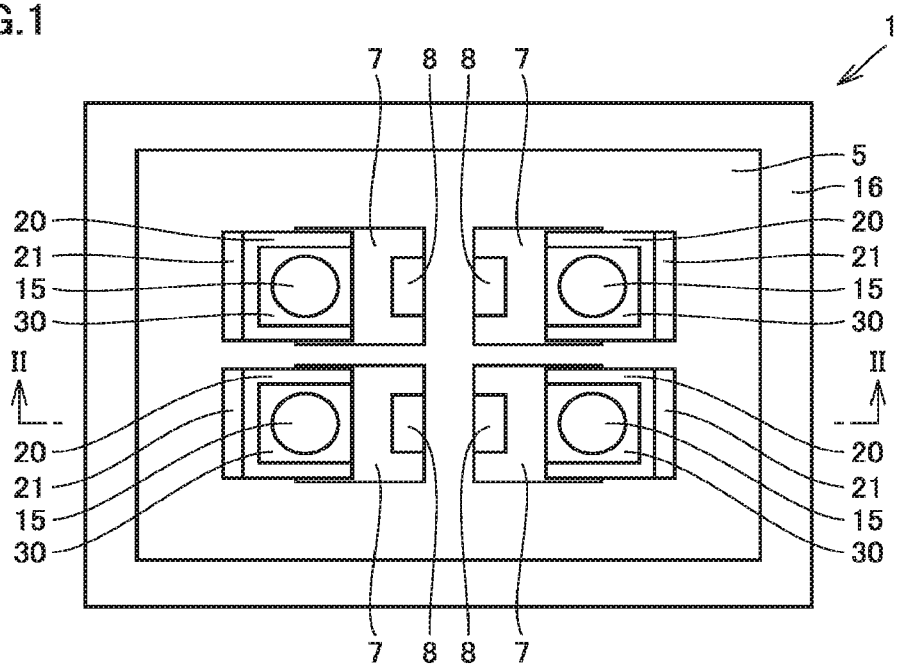
FIG. 1 is a schematic plan view of a semiconductor apparatus according to a first embodiment of the present invention.

The present invention will now be described in embodiments hereinafter. Note that identical components are identically denoted and will not be described redundantly.

First Embodiment

With reference to FIGS. 1 to 4, a semiconductor apparatus 1 according to a first embodiment will be described. Semiconductor apparatus 1 of the present embodiment mainly comprises a first substrate 5, a semiconductor device 7, a second substrate 10, a first pad 30, and a first flexible connecting member 33. Semiconductor apparatus 1 of the present embodiment may further comprise a second pad 8, a first fixing portion 35, a supporting member 20, an insulating layer 28, second flexible connecting members 22, 23, 24, a second fixing portion 25, and a first bonding portion 26.

First substrate 5 has a first surface 6. First substrate 5 may be a wafer. In the present embodiment, first substrate 5 is a silicon (Si) wafer. First substrate 5 may be a glass substrate, a silicon carbide (SiC) substrate, or a gallium arsenide (GaAs) substrate, for example.

Semiconductor apparatus 1 comprises one or more semiconductor devices 7. Semiconductor device 7 may be an electronic circuit or a microelectromechanical system (MEMS), for example. One or more semiconductor devices 7 may be provided on and/or in first surface 6. Semiconductor device 7 may be formed by processing first surface 6 of first substrate 5. Semiconductor device 7 may be placed on first surface 6 of first substrate 5.

Figure 2:
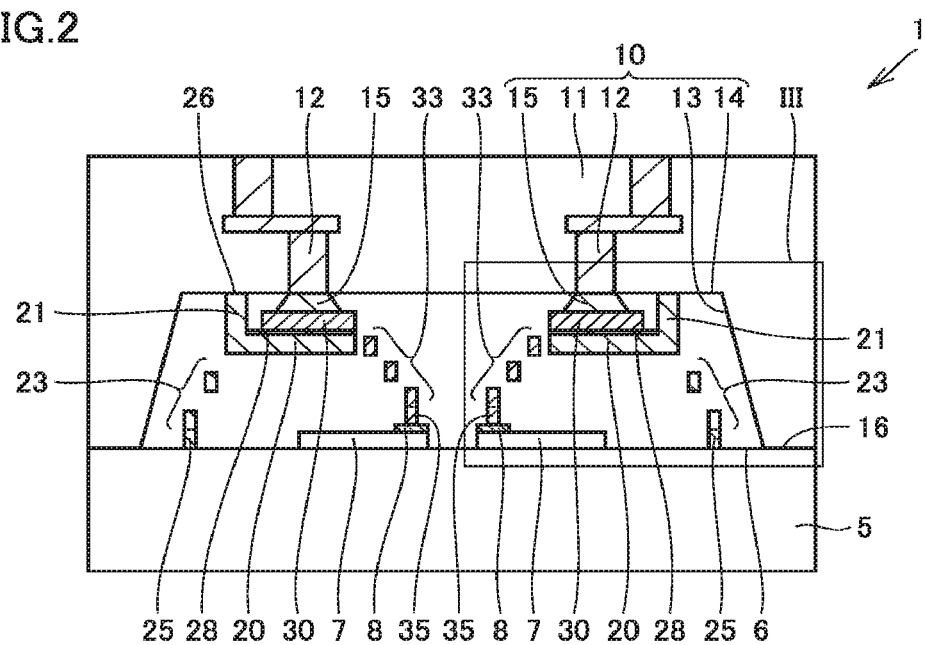
FIG. 2 is a schematic cross section of the semiconductor apparatus according to the first embodiment of the present invention, taken along a line II-II shown in FIG. 1.
Figure 3:
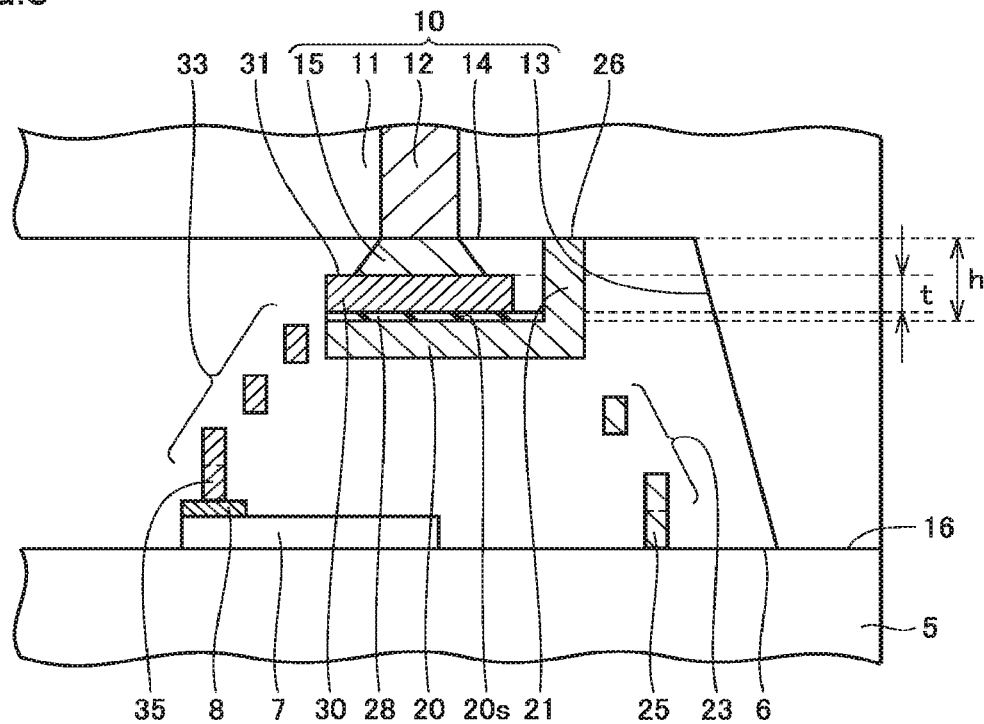
FIG. 3 is a schematic partial enlarged cross section of the semiconductor apparatus according to the first embodiment of the present invention at a region III shown in FIG. 2, and is a schematic cross section taken along a line shown in FIG. 4.

Second pad 8 is electrically connected to semiconductor device 7. As shown in FIGS. 1 to 3, second pad 8 may be provided on a peripheral portion of an upper surface of semiconductor device 7. Second pad 8 may be provided on first surface 6 around semiconductor device 7. Specifically, second pad 8 may be provided on first surface 6 around semiconductor device 7 via an insulating film (not shown). Second pad 8 may be composed of a material having a low electrical resistivity such as, for example, gold (Au).

Semiconductor apparatus 1 comprises at least one first flexible connecting member 33. First flexible connecting member 33 is electrically connected to semiconductor device 7. Specifically, first flexible connecting member 33 may be electrically connected to semiconductor device 7 via second pad 8 and first fixing portion 35.

First flexible connecting member 33 is attached to first substrate 5. Specifically, first flexible connecting member 33 may be attached to first substrate 5 via first fixing portion 35 and second pad 8. First flexible connecting member 33 may be attached to first substrate 5 via first fixing portion 35, second pad 8, and semiconductor device 7. First flexible connecting member 33 may be mechanically fixed to second pad 8 via first fixing portion 35. First flexible connecting member 33 is spaced from first surface 6 of first substrate 5, and a second surface 14 of second substrate 10. First flexible connecting member 33 is configured to be deformable with respect to first substrate 5 and second substrate 10. First flexible connecting member 33 may be a first beam having a meandering shape. First flexible connecting member 33 may be a first beam shaped in an elongate ring. First flexible connecting member 33 may be a first beam composed of metal. First flexible connecting member 33 may be composed of gold (Au), platinum (Pt), copper (Cu), or aluminum (Al), for example.

First fixing portion 35 electrically connects and mechanically fixes first flexible connecting member 33 to second pad 8. First fixing portion 35 may be integrated with first flexible connecting member 33. First fixing portion 35 electrically connects first flexible connecting member 33 to second pad 8. First fixing portion 35 may be composed for example of gold (Au), platinum (Pt), copper (Cu) or aluminum (Al). First fixing portion 35 may be composed of a material identical to a material of first flexible connecting member 33.

Second substrate 10 has second surface 14 facing first surface 6 of first substrate 5. Second substrate 10 covers semiconductor device 7. Second substrate 10 may mechanically protect semiconductor device 7. Second substrate 10 is a low-temperature co-fired ceramic (LTCC) substrate 11 containing alkali metal ions. The alkali metal ions contained in second substrate 10 that is LTCC substrate 11 may be, for example, lithium (Li) or sodium (Na). Specifically, second substrate 10 may be LTCC substrate 11 including silicon dioxide ($SiO_2$) as a major component, alumina ($Al_2O_3$), and an alkali metal oxide. The alkali metal oxide included in second substrate 10 that is LTCC substrate 11 may be lithium oxide ($Li_2O$) or sodium oxide ($Na_2O$), for example.

Second substrate 10 includes a bump 15 protruding from second surface 14, and an interconnect 12 electrically connected to bump 15. Second substrate 10 may also include an electronic circuit, such as a capacitor, a coil, and a resistor, therein. Interconnect 12 may be a via interconnect which penetrates second substrate 10. Interconnect 12 may be electrically connected to an electronic circuit such as a capacitor, a coil, a resistor or the like inside second substrate 10.

Second substrate 10 that is LTCC substrate 11 increases the degree of freedom in designing interconnect 12. Second substrate 10 that is LTCC substrate 11 allows interconnect 12 such as a via interconnect to be easily and inexpensively formed inside second substrate 10. Second substrate 10 that is LTCC substrate 11 allows an electronic circuit such as a capacitor, a coil, a resistor or the like to be easily and inexpensively formed inside second substrate 10.

Interconnect 12 may be composed of a material having a low electric resistivity, such as gold (Au), platinum (Pt), silver (Ag) or copper (Cu), for example. Interconnect 12 may be composed, for example, of a material having a low electrical resistivity, such as gold (Au), platinum (Pt), silver (Ag) or copper (Cu), and an inorganic additive such as silicon dioxide ($SiO_2$) or alumina ($Al_2O_3$).

Bump 15 may be composed of a material having a low electrical resistivity such as gold (Au), platinum (Pt), silver (Ag), copper (Cu) or solder, for example. Bump 15 may be porous. Bump 15 has at least a portion overlapping first pad 30 in a plan view seen in a direction along a normal to first surface 6.

Second substrate 10 may include a cavity 13 on a side facing first substrate 5. Semiconductor device 7, first pad 30, first flexible connecting member 33, supporting member 20, and second flexible connecting members 22, 23, 24 may be accommodated in cavity 13. Bump 15 protrudes from second surface 14 of second substrate 10 toward cavity 13.

First pad 30 is connected to first flexible connecting member 33 electrically and mechanically. First pad 30 is electrically connected to second pad 8 via first flexible connecting member 33 and first fixing portion 35. First pad 30 may be integrated with first flexible connecting member 33. First pad 30 may be composed of a material identical to a material of first flexible connecting member 33. First pad 30, first flexible connecting member 33, and first fixing portion 35 may be integrated together. First pad 30 may be composed of a material identical to a material of first flexible connecting member 33 and first fixing portion 35.

First pad 30 is electrically connected and mechanically bonded to interconnect 12 via bump 15. Bump 15 electrically connects and mechanically bonds first pad 30 and interconnect 12 to each other. Referring to FIG. 1, first pad 30 has at least a portion overlapping semiconductor device 7 in the plan view seen in the direction along the normal to first surface 6. First pad 30 may have at least a portion located over and spaced from semiconductor device 7.

First pad 30 may have a first main surface 31 facing second surface 14 of second substrate 10. First main surface 31 is a main surface facing away from first substrate 5. Bump 15 may be located between second surface 14 of second substrate 10 and first main surface 31 of first pad 30. First pad 30 is spaced from first surface 6 of first substrate 5. First main surface 31 of first pad 30 may spaced from second surface 14 of second substrate 10.

First pad 30 is electrically connected and mechanically bonded to bump 15. First pad 30 may be thermocompression-bonded to bump 15. First pad 30 may crush at least a portion of bump 15. First pad 30 may be a metal film. First pad 30 may be composed for example of gold (Au), platinum (Pt), copper (Cu) or aluminum (Al). First pad 30 is preferably composed of gold (Au). First pad 30 composed of gold (Au) can be firmly bonded to bump 15.

Semiconductor apparatus 1 comprises one or more second flexible connecting members 22, 23, 24. Second flexible connecting members 22, 23, 24 are mechanically connected to first surface 6 of first substrate 5. Specifically, second flexible connecting members 22, 23, 24 may be mechanically fixed to first surface 6 of first substrate 5 via second fixing portion 25. Second flexible connecting members 22, 23, 24 are spaced from first surface 6 of first substrate 5 and second surface 14 of second substrate 10. Second flexible connecting members 22, 23, 24 are configured to be deformable with respect to first substrate 5 and second substrate 10. Second flexible connecting members 22, 23, 24 may each be a second beam shaped in an elongate ring. Second flexible connecting members 22, 23, 24 may each be a second beam having a meandering shape. Second flexible connecting members 22, 23, 24 may each be a second beam composed of polysilicon. Second flexible connecting members 22, 23, 24 may each be composed of a material identical to a material of supporting member 20.

Second fixing portion 25 mechanically fixes each of second flexible connecting members 22, 23, 24 to first surface 6 of first substrate 5. Second fixing portion 25 may be integrated with second flexible connecting members 22, 23, 24. Supporting member 20, second flexible connecting members 22, 23, 24 and second fixing portion 25 may be integrated together. Supporting member 20 is mechanically connected to first substrate 5 via second flexible connecting members 22, 23, 24 and second fixing portion 25. Second fixing portion 25 may be composed of polysilicon, for example. Second fixing portion 25 may be composed of a material identical to a material of second flexible connecting members 22, 23, 24. Second fixing portion 25 may be composed of a material identical to a material of second flexible connecting members 22, 23, 24 and supporting member 20.

Supporting member 20 supports first pad 30. Supporting member 20 may have a second main surface 20s facing second surface 14 of second substrate 10. First pad 30 may be formed on second main surface 20s of supporting member 20. Even if first pad 30 is a thin film, supporting member 20 mechanically reinforces and also supports first pad 30. Supporting member 20 may have at least a portion overlapping semiconductor device 7 in the plan view seen in the direction along the normal to first surface 6. Supporting member 20 may have at least a portion located over and spaced from semiconductor device 7. Supporting member 20 may be composed of polysilicon, for example.

Figure 4:
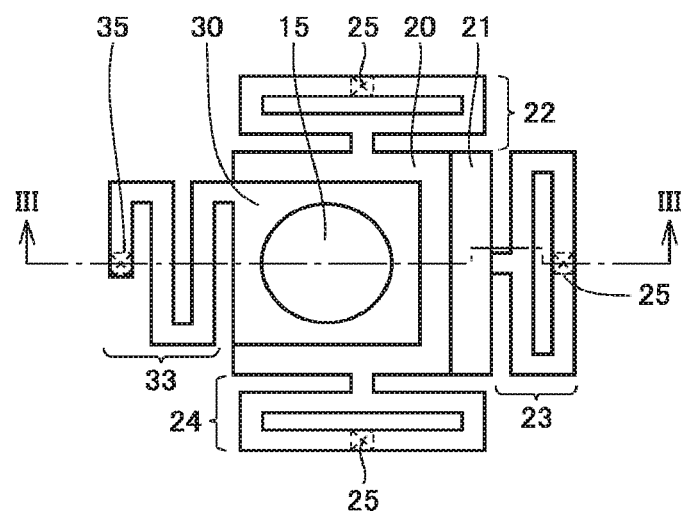
FIG. 4 is a schematic partial enlarged plan view of the semiconductor apparatus according to the first embodiment of the present invention.

Supporting member 20 is mechanically connected to second flexible connecting members 22, 23, 24. Supporting member 20 may be integrated with second flexible connecting members 22, 23, 24. As shown in FIG. 4, supporting member 20 may be mechanically connected at mutually different positions to second flexible connecting members 22, 23, 24, respectively. Referring to FIG. 4, in a plan view seen in a direction in which first substrate 5 and second substrate 10 overlap, first pad 30 may be located between first flexible connecting member 33 and second flexible connecting member 23. In the plan view seen in the direction in which first substrate 5 and second substrate 10 overlap, first pad 30 may be located between second flexible connecting member 22 and second flexible connecting member 24.

Supporting member 20 may have protrusion 21. Protrusion 21 protrudes away from first surface 6. Protrusion 21 protrudes toward second substrate 10. With reference to FIG. 3, a height h of protrusion 21 is larger than a thickness t of first pad 30. In the present specification, height h of protrusion 21 means a height measured from second main surface 20s of supporting member 20. Protrusion 21 may be in or out of contact with second surface 14 of second substrate 10. Protrusion 21 prevents first pad 30 on supporting member 20 from colliding with second surface 14 of second substrate 10. Protrusion 21 ensures a space in which bump 15 is disposed between second surface 14 of second substrate 10 and first pad 30. Protrusion 21 may be separated from first pad 30. Protrusion 21 may be composed for example of polysilicon.

First bonding portion 26 may bonds supporting member 20 to second substrate 10. Supporting member 20 may be bonded to second substrate 10 via first bonding portion 26. Specifically, supporting member 20 may have protrusion 21 bonded to second substrate 10 via first bonding portion 26. First bonding portion 26 reinforces the electrical connection and mechanical bonding made between first pad 30 and interconnect 12 via bump 15. In the present embodiment, first bonding portion 26 is an anodic bonding portion. First bonding portion 26 is not limited to an anodic bonding portion, and may be for example a surface activated bonding portion.

Insulating layer 28 may be provided between first pad 30 and supporting member 20. Insulating layer 28 may be provided on second main surface 20s of supporting member 20. Insulating layer 28 electrically insulates first pad 30 from supporting member 20. Insulating layer 28 may be composed of silicon nitride or silicon dioxide, for example. An uppermost portion of protrusion 21 farthest from first substrate 5 may be exposed from insulating layer 28. An uppermost portion of protrusion 21 closest to second substrate 10 may be exposed from insulating layer 28.

Semiconductor device 7 may be sealed by first substrate 5 and second substrate 10. Specifically, second substrate 10 may be bonded to first substrate 5 via a third bonding portion 16. Third bonding portion 16 may bond second substrate 10 to first substrate 5. In the present embodiment, second substrate 10 is LTCC substrate 11 including alkali metal ions, and third bonding portion 16 is an anodic bonding portion. Third bonding portion 16 is not limited to an anodic bonding portion, and may be for example a surface activated bonding portion.

First substrate 5 and second substrate 10 may seal semiconductor device 7 on first substrate 5. First substrate 5 may be a wafer and first substrate 5 and second substrate 10 may configure a wafer level package sealing semiconductor device 7 on first substrate 5. The wafer level package can increase the number of chips obtained from a single wafer.

With reference to FIGS. 5 to 14, a method for manufacturing semiconductor apparatus 1 of the present embodiment will be described.

Figure 5:
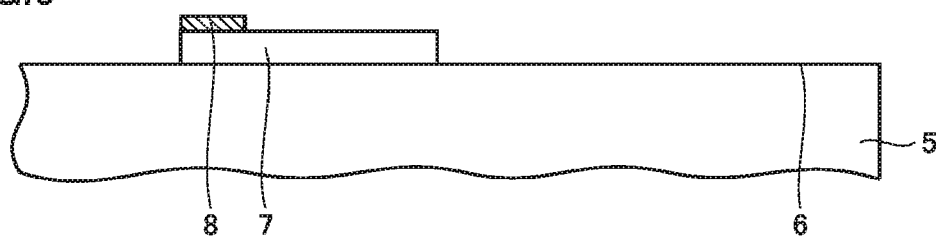
FIG. 5 is a schematic partial enlarged cross section showing one step of a method for manufacturing a semiconductor apparatus according to the first embodiment to a third embodiment of the present invention.

Referring to FIG. 5, the method for manufacturing semiconductor apparatus 1 of the present embodiment comprises providing semiconductor device 7 on and/or in first surface 6 of first substrate 5. As an example, semiconductor device 7 may be placed on first surface 6 of first substrate 5. As another example, semiconductor device 7 may be formed by processing first surface 6 of first substrate 5. The method for manufacturing semiconductor apparatus 1 of the present embodiment may further comprise forming second pad 8 electrically connected to semiconductor device 7. Second pad 8 may be formed on a peripheral portion of an upper surface of semiconductor device 7, for example. Second pad 8 may be formed on first surface 6 around semiconductor device 7, for example. Second pad 8 may be formed on first surface 6 around semiconductor device 7 via an insulating film (not shown), for example.

Figure 6:
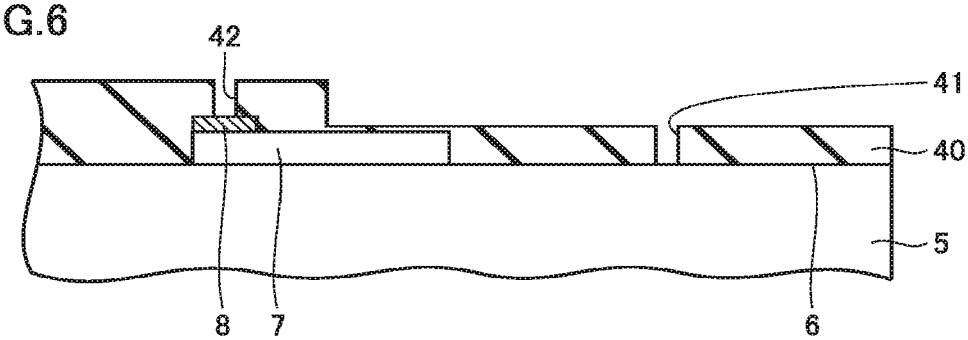
FIG. 6 is a schematic partial enlarged cross section in the method for manufacturing the semiconductor apparatus according to the first embodiment of the present invention at a step subsequent to the step shown in FIG. 5.

Referring to FIG. 6, the method for manufacturing semiconductor apparatus 1 of the present embodiment may comprise forming a sacrificial layer 40 on first surface 6 of first substrate 5. Specifically, sacrificial layer 40 may be formed on semiconductor device 7, second pad 8, and first surface 6 of first substrate 5 exposed from semiconductor device 7 and second pad 8. Sacrificial layer 40 may be composed for example of silicon dioxide.

Then, the method for manufacturing semiconductor apparatus 1 of the present embodiment may comprise forming a first through hole 41 through sacrificial layer 40 to expose a portion of first surface 6 of first substrate 5, and a second through hole 42 through sacrificial layer 40 to expose a portion of second pad 8. For example, first through hole 41 and second through hole 42 may be formed through photolithography.

Figure 7:
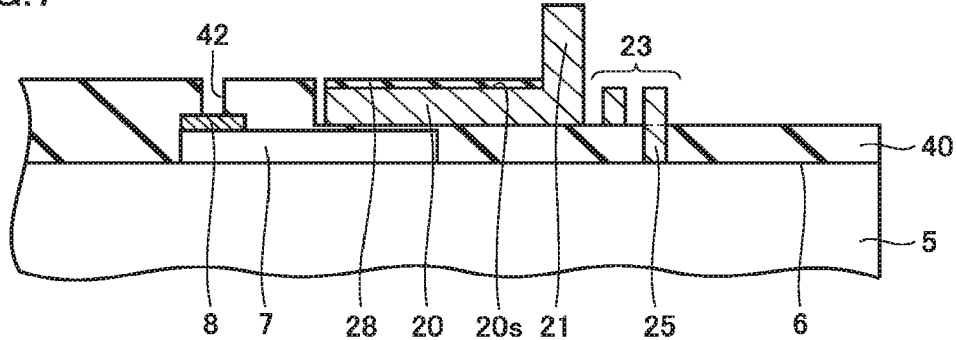
FIG. 7 is a schematic partial enlarged cross section in the method for manufacturing the semiconductor apparatus according to the first embodiment of the present invention at a step subsequent to the step shown in FIG. 6.
Figure 8:
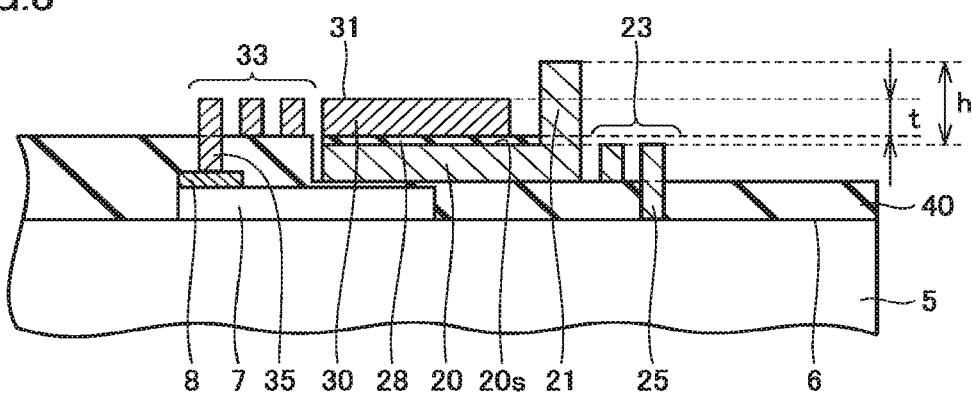
FIG. 8 is a schematic partial enlarged cross section in the method for manufacturing the semiconductor apparatus according to the first embodiment of the present invention at a step subsequent to the step shown in FIG. 7.
Figure 9:
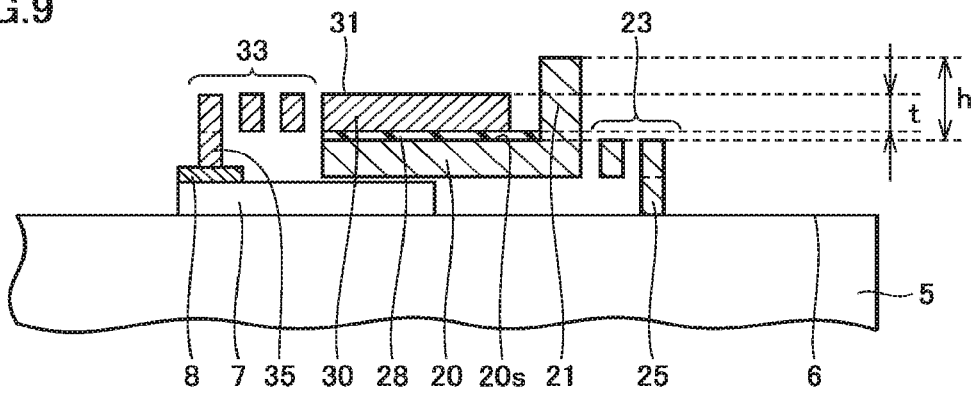
FIG. 9 is a schematic partial enlarged cross section in the method for manufacturing the semiconductor apparatus according to the first embodiment of the present invention at a step subsequent to the step shown in FIG. 8.

With reference to FIGS. 7 to 9, the method for manufacturing semiconductor apparatus 1 of the present embodiment comprises forming first flexible connecting member 33 electrically connected to semiconductor device 7, and forming above first surface 6 of first substrate 5 first pad 30 electrically and mechanically connected to first flexible connecting member 33. First pad 30 is formed to have at least a portion overlapping semiconductor device 7 in the plan view seen in the direction along the normal to first surface 6. Specifically, forming first flexible connecting member 33 may comprise forming first fixing portion 35 electrically connecting and mechanically fixing first flexible connecting member 33 to second pad 8.

The method for manufacturing semiconductor apparatus 1 of the present embodiment may further comprise forming second flexible connecting members 22, 23, 24 mechanically connected to first surface 6 of first substrate 5, and forming above first surface 6 of first substrate 5 supporting member 20 mechanically connected to second flexible connecting members 22, 23, 24. Forming first pad 30 may comprise forming first pad 30 on supporting member 20.

Specifically, forming second flexible connecting members 22, 23, 24 may comprise forming second fixing portion 25 mechanically fixing second flexible connecting members 22, 23, 24 to first surface 6 of first substrate 5. Specifically, the method for manufacturing semiconductor apparatus 1 of the present embodiment may further comprise forming insulating layer 28 on supporting member 20. In the method for manufacturing semiconductor apparatus 1 of the present embodiment, forming first pad 30 may comprise forming first pad 30 on insulating layer 28.

Specifically, referring to FIG. 7, the method for manufacturing semiconductor apparatus 1 of the present embodiment may comprise forming supporting member 20, second flexible connecting members 22, 23, 24, and second fixing portion 25 on sacrificial layer 40. More specifically, a polysilicon film is formed on sacrificial layer 40. The polysilicon film is filled in first through hole 41. Photolithography or the like is employed to pattern the polysilicon film. In this way, supporting member 20, second flexible connecting members 22, 23, 24, and second fixing portion 25 may be formed in the same process. Specifically, supporting member 20 may be formed to have at least a portion overlapping semiconductor device 7 in the plan view seen in the direction along the normal to first surface 6.

The method for manufacturing semiconductor apparatus 1 of the present embodiment may further comprise forming on supporting member 20 protrusion 21 protruding away from first surface 6. For example, protrusion 21 may be formed by photolithographically patterning a polysilicon film formed on sacrificial layer 40. Specifically, protrusion 21 may be formed in the same process as supporting member 20.

The method for manufacturing semiconductor apparatus 1 of the present embodiment may further comprise forming insulating layer 28 on supporting member 20. Specifically, the method for manufacturing semiconductor apparatus 1 of the present embodiment may comprise forming insulating layer 28 on second main surface 20s of supporting member 20. Insulating layer 28 may be composed for example of silicon nitride or silicon dioxide. An uppermost portion of protrusion 21 farthest from first substrate 5 may be exposed from insulating layer 28. An uppermost portion of protrusion 21 closest to second substrate 10 may be exposed from insulating layer 28.

Referring to FIG. 8, the method for manufacturing semiconductor apparatus 1 of the present embodiment may comprise forming first pad 30 on supporting member 20. First pad 30 has at least a portion overlapping semiconductor device 7 in the plan view seen in the direction along the normal to first surface 6. First pad 30 has first main surface 31 facing away from first substrate 5. Height h of protrusion 21 is larger than thickness t of first pad 30. Specifically, the method for manufacturing semiconductor apparatus 1 of the present embodiment may comprise forming insulating layer 28 on second main surface 20s of supporting member 20, and forming first pad 30 on insulating layer 28. First pad 30 may be formed to be separate from protrusion 21. The method for manufacturing semiconductor apparatus 1 of the present embodiment may comprise forming first flexible connecting member 33 and first fixing portion 35 on sacrificial layer 40.

Specifically, a metal film is formed on sacrificial layer 40 and on insulating layer 28 on supporting member 20. The metal film is filled in second through hole 42. The metal film is preferably composed of gold (Au). Photolithography or the like is employed to pattern the metal film. In this way, first pad 30, first flexible connecting member 33, and first fixing portion 35 may be formed in the same process.

Referring to FIG. 9, the method for manufacturing semiconductor apparatus 1 of the present embodiment may comprise selectively removing sacrificial layer 40. Selectively removing sacrificial layer 40 may for example be dry etching using steam of hydrofluoric acid or wet etching using a solution of hydrofluoric acid. First pad 30 and first flexible connecting member 33 may be spaced from first surface 6 of first substrate 5 in a single step of selectively removing sacrificial layer 40. Thus, the method for manufacturing semiconductor apparatus 1 of the present embodiment may comprise forming first flexible connecting member 33 deformable with respect to first substrate 5. The method for manufacturing semiconductor apparatus 1 of the present embodiment may comprise forming first pad 30 displaceable with respect to first substrate 5.

Supporting member 20 and second flexible connecting members 22, 23, 24 may be spaced from first surface 6 of first substrate 5 in a single step of selectively removing sacrificial layer 40. Thus, the method for manufacturing semiconductor apparatus 1 of the present embodiment may comprise forming second flexible connecting members 22, 23, 24 deformable with respect to first substrate 5. The method for manufacturing semiconductor apparatus 1 of the present embodiment may comprise forming supporting member 20 displaceable with respect to first substrate 5. First pad 30, first flexible connecting member 33, supporting member 20, and second flexible connecting members 22, 23, 24 may be spaced from first surface 6 of first substrate 5 in a single step of selectively removing sacrificial layer 40.

Figure 10:
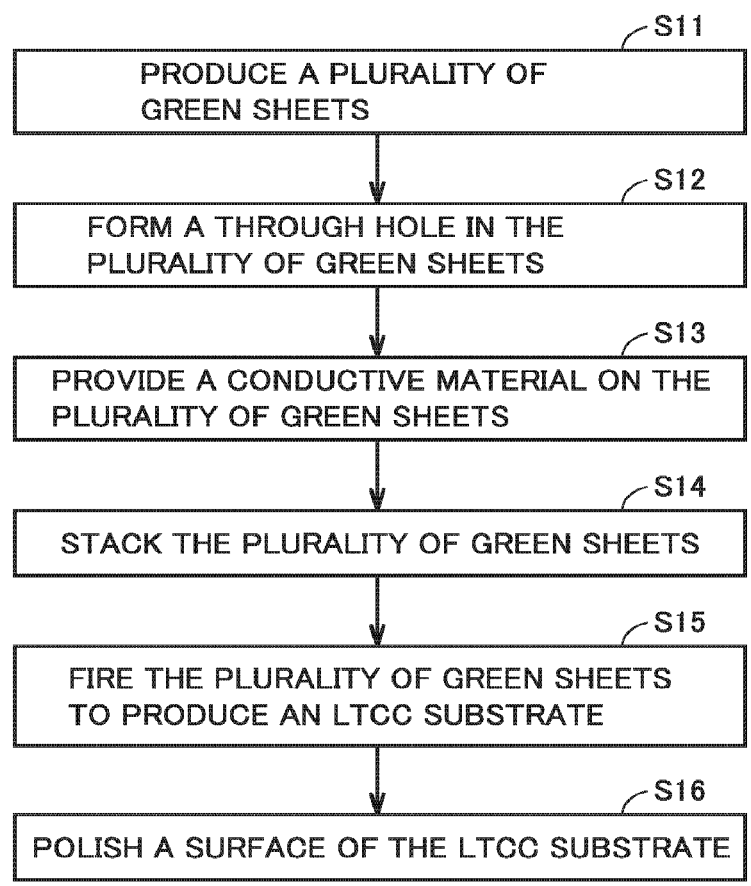
FIG. 10 is a flowchart of the method for manufacturing the semiconductor apparatus according to the first embodiment of the present invention for a process of producing an LTCC substrate.
Figure 11:
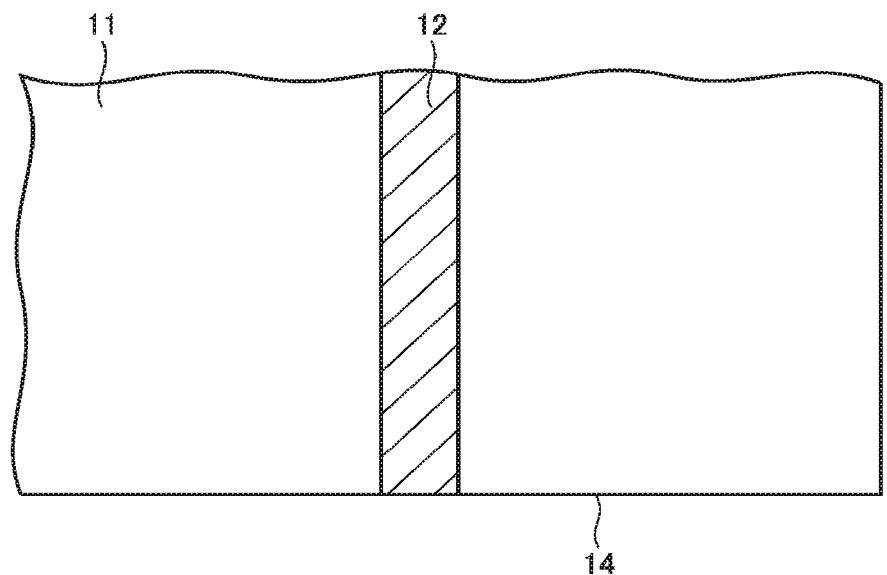
FIG. 11 is a schematic partial enlarged cross section in the method for manufacturing the semiconductor apparatus according to the first embodiment of the present invention at a step of a process of preparing a second substrate.
Figure 12:
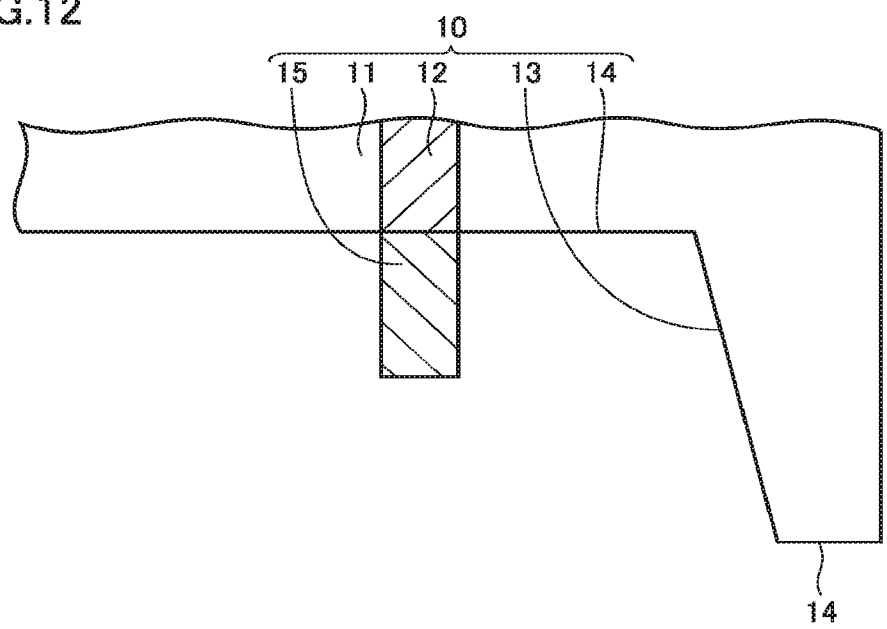
FIG. 12 is a schematic partial enlarged cross section in the method for manufacturing the semiconductor apparatus according to the first embodiment of the present invention at a step of the process of preparing the second substrate subsequent to the step shown in FIG. 11.

With reference to FIG. 10 to FIG. 12, the method for manufacturing semiconductor apparatus 1 of the present embodiment may further comprise preparing second substrate 10. Preparing second substrate 10 may comprise producing LTCC substrate 11.

Referring to FIG. 10, producing LTCC substrate 11 may comprise producing a plurality of green sheets (S11). Specifically, a slurry containing a powdery source material and an organic binder is prepared. The powdery source material may include silicon dioxide ($SiO_2$), alumina ($Al_2O_3$), and lithium oxide ($Li_2O$), sodium oxide ($Na_2O$), or a similar alkali metal oxide, for example. The organic binder may for example be polyvinyl alcohol. The plurality of green sheets are produced by applying the slurry to a substrate and drying it.

Producing LTCC substrate 11 may comprise forming a through hole in the plurality of green sheets (S12). For example, the through hole may be formed in the plurality of green sheets by a punching or laser-processing.

Producing LTCC substrate 11 may comprise providing a conductive material on the plurality of green sheets (S13). For example, the conductive material may be filled in the through hole by a screen-printing method. Further, screen-printing may be used to provide the conductive material on a surface of the plurality of green sheets. Providing the conductive material on the surface of the plurality of green sheets may comprise forming an electronic circuit such as a capacitor, a coil, a resistor and the like on the surface of the plurality of green sheets.

Producing LTCC substrate 11 may comprise stacking the plurality of green sheets (S14). Specifically, the plurality of green sheets may be stacked while being aligned with one another.

Producing LTCC substrate 11 may comprise producing LTCC substrate 11 by firing the plurality of green sheets (S15). The plurality of green sheets are fired at a low temperature such as 850° C. or higher and 900° C. or lower. When the plurality of green sheets are fired, the conductive material on the plurality of green sheets may also be fired to form interconnect 12 such as a via interconnect.

Producing LTCC substrate 11 may comprise polishing a surface of LTCC substrate 11 (S16). A portion of second surface 14 of LTCC substrate 11 can later be a portion of second surface 14 of second substrate 10 bonded to first substrate 5. Second surface 14 of LTCC substrate 11 may be polished. Second surface 14 of LTCC substrate 11 may have a surface roughness of 1 μm or less, preferably 100 nm, more preferably 50 nm or less. For example, when second substrate 10 is bonded to first substrate 5 using an adhesive, second surface 14 preferably has a surface roughness of 1 μm or less. For example, when second substrate 10 is bonded to first substrate 5 by using anodic bonding, second surface 14 preferably has a surface roughness of 50 nm or less. In this way, LTCC substrate 11 shown in FIG. 11 is obtained.

Referring to FIG. 12, preparing second substrate 10 may comprise forming cavity 13 in LTCC substrate 11 by removing a portion of second surface 14 of LTCC substrate 11. For example, cavity 13 may be formed in LTCC substrate 11 by etching a portion of second surface 14 of LTCC substrate 11 with a hydrofluoric acid solution.

Referring to FIG. 12, preparing second substrate 10 may comprise forming bump 15 protruding from second surface 14 of LTCC substrate 11. In one example, when etching a portion of second surface 14 of LTCC substrate 11 to form cavity 13, a portion of interconnect 12 may be left in cavity 13 to form bump 15 protruding from second surface 14 of LTCC substrate 11. For example, by using an etchant having a higher etching rate for LTCC substrate 11 than interconnect 12, cavity 13 is formed in LTCC substrate 11 and bump 15 is formed to protrude into cavity 13 from second surface 14 of LTCC substrate 11. In this manner, cavity 13, and bump 15 electrically connected to interconnect 12 may be formed through a single step. Cavity 13, and bump 15 integrated with interconnect 12 may be formed through a single step.

Specifically, when etching a portion of second surface 14 of LTCC substrate 11, a portion of interconnect 12 may also be etched to form porous bump 15. For example, when etching a portion of second surface 14 of LTCC substrate 11 to form cavity 13, interconnect 12 composed of a conductive material such as gold (Au) and an inorganic additive such as silicon dioxide ($SiO_2$) may have the inorganic additive selectively etched to form porous bump 15. Thus, second substrate 10 including cavity 13, bump 15 protruding from second surface 14, and interconnect 12 electrically connected to bump 15, as shown in FIG. 12, is obtained.

In another example of forming bump 15 protruding from second surface 14 of LTCC substrate 11, cavity 13 is formed in LTCC substrate 11 by etching a portion of second surface 14 of LTCC substrate 11. Then, bump 15 made of solder is formed on interconnect 12 exposed from second surface 14 of LTCC substrate 11. In this way, second substrate 10 including cavity 13, bump 15 protruding from second surface 14, and interconnect 12 electrically connected to bump 15 may be obtained.

Figure 13:
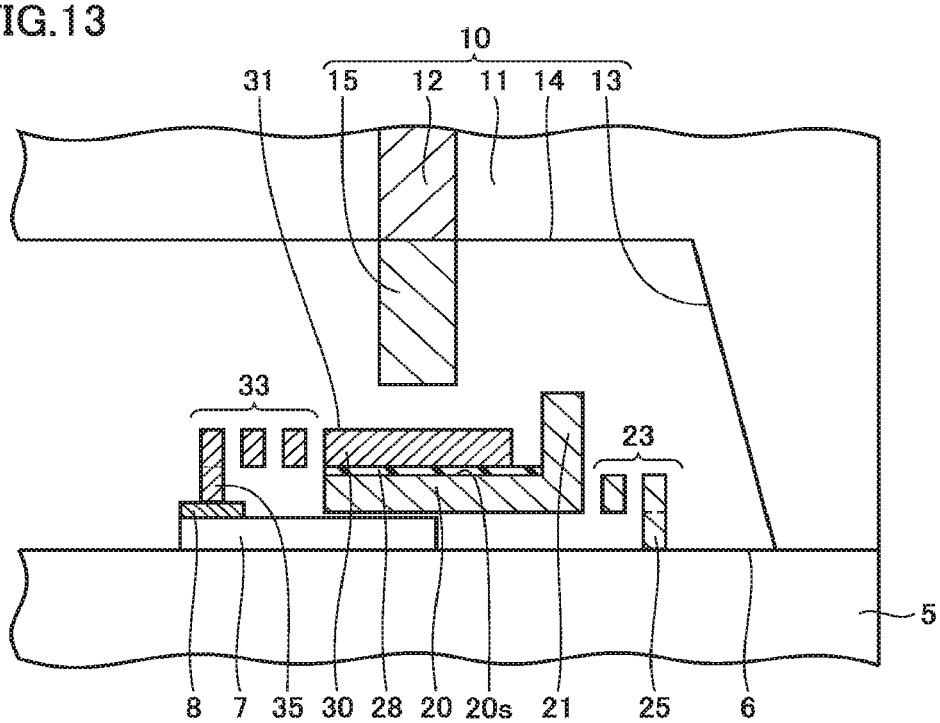
FIG. 13 is a schematic partial enlarged cross section in the method for manufacturing the semiconductor apparatus according to the first embodiment of the present invention at a step subsequent to the steps shown in FIGS. 9 and 12.

Referring to FIG. 13, the method for manufacturing semiconductor apparatus 1 of the present embodiment comprises disposing second substrate 10 including bump 15 and interconnect 12 electrically connected to bump 15 so as to cover semiconductor device 7. Disposing second substrate 10 includes disposing second substrate 10 such that the second substrate 10 second surface 14 with bump 15 protruding therefrom faces first surface 6 of first substrate 5 and bump 15 has at least a portion overlapping first pad 30 in the plan view seen in the direction along the normal to first surface 6. Second substrate 10 may be disposed such that second surface 14 of second substrate 10 faces first main surface 31 of first pad 30. Specifically, the entire bump 15 may overlap first pad 30 in the plan view seen in the direction along the normal to first surface 6. Bump 15 may have at least a portion overlapping semiconductor device 7 in the plan view seen in the direction along the normal to first surface 6. Second substrate 10 is a low-temperature sintered ceramic (LTCC) substrate 11 containing alkali metal ions.

Figure 14:
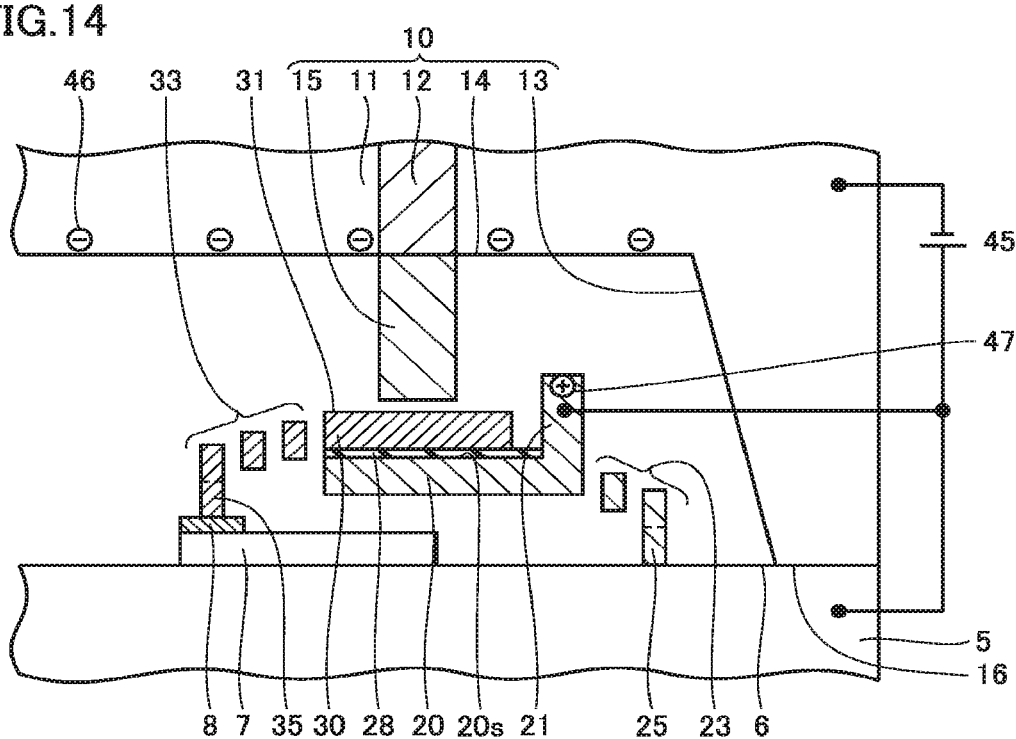
FIG. 14 is a schematic partial enlarged cross section in the method for manufacturing the semiconductor apparatus according to the first embodiment of the present invention at a step subsequent to the step shown in FIG. 13.

Referring to FIG. 14, the method for manufacturing semiconductor apparatus 1 of the present embodiment comprises applying heat and a first voltage to second substrate 10 to move first pad 30 toward second surface 14 to electrically connect and mechanically bond first pad 30 to interconnect 12 via bump 15.

Specifically, first substrate 5 and second substrate 10 are heated. First substrate 5 and second substrate 10 may be heated to have a temperature of 100° C. or higher and 500° C. or lower, preferably 200° C. or higher and 400° C. or lower. Heating second substrate 10 helps alkali metal ions in second substrate 10, or LTCC substrate 11, to move.

The first voltage is applied to second substrate 10. A second voltage different from the first voltage is applied to supporting member 20. Specifically, the second voltage may be larger than the first voltage. For example, supporting member 20 may be connected to the positive electrode of a power supply 45, and second substrate 10 may be connected to the negative electrode of power supply 45. Power supply 45 is a DC power supply. The first voltage may be applied to second substrate 10 via a dummy glass substrate (not shown) disposed on second substrate 10. The dummy glass substrate prevents the first voltage from being applied to semiconductor device 7 via interconnect 12, bump 15, first pad 30, first flexible connecting member 33, first fixing portion 35 and second pad 8, and can thus prevent semiconductor device 7 from being electrically destroyed.

When power supply 45 is used to apply the first voltage and the second voltage to second substrate 10 and supporting member 20, respectively, the alkali metal ions in second substrate 10 move from second surface 14 toward the negative electrode of power supply 45. In second surface 14 of second substrate 10, a first charged layer 46, which is a layer depleted of alkali metal ions, is formed. In second substrate 10 before the first voltage is applied thereto, alkali metal ions exist with their charges in balance with those of negative ions such as oxygen ions. The negative ions are less mobile than the alkali metal ions. First charged layer 46 is composed of negative ions left behind by applying the first voltage. First charged layer 46 is a negatively charged layer. Through electrostatic induction, first charged layer 46 induces a second charged layer 47 opposite in polarity to first charged layer 46 in a surface of supporting member 20 facing second surface 14. Specifically, first charged layer 46 induces second charged layer 47 in a surface of protrusion 21 of supporting member 20. Second charged layer 47 is a positively charged layer. An electrostatic attractive force is generated between first charged layer 46 and second charged layer 47 opposite in polarity to first charged layer 46.

Since first pad 30 is mechanically connected to first flexible connecting member 33, first pad 30 is configured to be displaceable with respect to first substrate 5 and second substrate 10. Since supporting member 20 supporting first pad 30 is mechanically connected to second flexible connecting members 22, 23, 24, supporting member 20 is also configured to be displaceable with respect to first substrate 5 and second substrate 10. Accordingly, the electrostatic attractive force causes supporting member 20 to move toward second surface 14 of second substrate 10.

Supporting member 20 may contact second surface 14 of second substrate 10. Specifically, protrusion 21 of supporting member 20 may contact second surface 14 of second substrate 10. Since the first voltage and the second voltage are respectively applied to second substrate 10 and supporting member 20, a first bonding portion 26 that is an anodic bonding portion may be formed at a contact portion of supporting member 20 and second substrate 10. Specifically, first bonding portion 26 that is the anodic bonding portion may be formed at a contact portion of protrusion 21 of supporting member 20 and second substrate 10. In this way, supporting member 20 may be bonded to second substrate 10 via first bonding portion 26 that is the anodic bonding portion. Specifically, protrusion 21 of supporting member 20 may be bonded to second surface 14 of second substrate 10 via first bonding portion 26 that is the anodic bonding portion.

The movement of supporting member 20 towards second surface 14 moves toward second surface 14 first pad 30 supported by supporting member 20. First pad 30 contacts bump 15 protruding from second surface 14. First pad 30 may crush bump 15. First pad 30 is thus electrically connected and mechanically bonded to interconnect 12 via bump 15.

Referring to FIG. 14, the method for manufacturing semiconductor apparatus 1 of the present embodiment may further comprise sealing semiconductor device 7 by first substrate 5 and second substrate 10. That is, the method for manufacturing semiconductor apparatus 1 of the present embodiment may comprise bonding second substrate 10 to first substrate 5 via third bonding portion 16. Specifically, sealing semiconductor device 7 may comprise bonding second substrate 10 to first substrate 5 by anodic bonding. That is, sealing semiconductor device 7 may comprise bonding second substrate 10 to first substrate 5 via third bonding portion 16 that is an anodic bonding portion.

More specifically, sealing semiconductor device 7 may comprise applying a third voltage and the first voltage to first substrate 5 and second substrate 10, respectively, to anodically bond second substrate 10 to first substrate 5. Specifically, supporting member 20 and first substrate 5 are connected to each other electrically in parallel, and the third voltage may be substantially equal to the second voltage. That is, applying the second voltage to first pad 30 may comprise applying the second voltage to first substrate 5. By a single step of applying the first voltage to second substrate 10 and applying the second voltage to first substrate 5 and supporting member 20, first pad 30 may be electrically connected and mechanically bonded to bump 15 and second substrate 10 may be anodically bonded to first substrate 5.

Sealing semiconductor device 7 may comprise bonding second substrate 10 to first substrate 5 by surface activated bonding (SAB) rather than anodic bonding. Second substrate 10 may be bonded to first substrate 5 via third bonding portion 16 which is a surface activated bonding portion. Specifically, first surface 6 of first substrate 5 and second surface 14 of second substrate 10 are exposed to an ion beam or plasma to remove oxide film formed on first surface 6 and second surface 14, and a hydroxyl group, water molecules, an organic matter and the like adhering to first surface 6 and second surface 14. Atomic bonding is exposed on first surface 6 and second surface 14 exposed to the ion beam or the plasma. First surface 6 and second surface 14 exposed to the ion beam or the plasma have an active state which helps bonding with another atom. In an environment at room temperature or higher, second surface 14 having an active state is bonded to first surface 6 having an active state. Thus, second substrate 10 can be bonded to first substrate 5 by surface activated bonding (SAB).

Referring to FIG. 14, the method for manufacturing semiconductor apparatus 1 of the present embodiment may further comprise applying the first voltage and the second voltage to second substrate 10 and supporting member 20, respectively, to bond supporting member 20 to second substrate 10 via first bonding portion 26 that is an anodic bonding portion. Supporting member 20 is connected to the positive electrode of power supply 45, and second substrate 10 is connected to the negative electrode of power supply 45. Supporting member 20 may be anodically bonded to second substrate 10 by applying the first voltage and the second voltage to second substrate 10 and supporting member 20, respectively. Supporting member 20 may be bonded to second surface 14 of second substrate 10 via first bonding portion 26 that is an anodic bonding portion by applying the first voltage and the second voltage to second substrate 10 and supporting member 20, respectively.

The method for manufacturing semiconductor apparatus 1 of the present embodiment may further comprise forming insulating layer 28 on supporting member 20. The method for manufacturing semiconductor apparatus 1 of the present embodiment may comprise forming first pad 30 on insulating layer 28. Insulating layer 28 electrically insulates first pad 30 from supporting member 20. Insulating layer 28 can prevent the second voltage applied to supporting member 20 from being applied to semiconductor device 7 via first pad 30, first flexible connecting member 33, first fixing portion 35 and second pad 8. Thus, semiconductor apparatus 1 of the present embodiment shown in FIGS. 1 to 4 can be manufactured.

An effect of semiconductor apparatus 1 of the present embodiment and a method for manufacturing the same will now be described.

Semiconductor apparatus 1 of the present embodiment comprises first substrate 5 having first surface 6, semiconductor device 7 provided on and/or in first surface 6, first flexible connecting member 33 electrically connected to semiconductor device 7, first pad 30 electrically and mechanically connected to first flexible connecting member 33, and second substrate 10 having second surface 14 facing first surface 6 of first substrate 5, and covering semiconductor device 7. Second substrate 10 includes bump 15 protruding from second surface 14, and interconnect 12 electrically connected to bump 15. Second substrate 10 is low-temperature sintered ceramic (LTCC) substrate 11 containing alkali metal ions. First pad 30 is electrically connected and mechanically bonded to interconnect 12 via bump 15. First pad 30 has at least a portion overlapping semiconductor device 7 in the plan view seen in the direction along the normal to first surface 6. Bump 15 has at least a portion overlapping first pad 30 in the plan view seen in the direction along the normal to first surface 6.

In semiconductor apparatus 1 of the present embodiment, first pad 30 is electrically and mechanically connected to first flexible connecting member 33. This allows first pad 30 and bump 15 to be disposed to allow first pad 30 to have at least a portion overlapping semiconductor device 7 and bump 15 to have at least a portion overlapping first pad 30 in the plan view seen in the direction along the normal to first surface 6 without preventing semiconductor device 7 from operating. Semiconductor apparatus 1 of the present embodiment can be miniaturized even if first pad 30 is increased in size due to low positional accuracy of interconnect 12 and bump 15 of second substrate 10 that is low-temperature co-fired ceramic (LTCC) substrate 11.

With semiconductor apparatus 1 of the present embodiment, first pad 30 can be increased in size in semiconductor apparatus 1 having a small size. This ensures that first pad 30 can be electrically connected and mechanically bonded to interconnect 12 via bump 15 regardless of low positional accuracy of interconnect 12 and bump 15 of second substrate 10 that is low-temperature co-fired ceramic (LTCC) substrate 11.

Semiconductor apparatus 1 of the present embodiment may further comprise second flexible connecting member 22, 23, 24 mechanically connected to first surface 6 of first substrate 5, and supporting member 20 supporting first pad 30. Supporting member 20 may be mechanically connected to second flexible connecting members 22, 23, 24. This allows first pad 30 and bump 15 to be disposed to allow first pad 30 to have at least a portion overlapping semiconductor device 7 and bump 15 to have at least a portion overlapping first pad 30 in the plan view seen in the direction along the normal to first surface 6 without preventing semiconductor device 7 from operating. Semiconductor apparatus 1 of the present embodiment can be miniaturized.

Furthermore, first flexible connecting member 33 and second flexible connecting members 22, 23, 24 allow first pad 30 to have first main surface 31 steadily facing second surface 14 of second substrate 10. First pad 30 can be reliably bonded to bump 15 over a large area. According to semiconductor apparatus 1 of the present embodiment, first pad 30 and interconnect 12 can be steadily, electrically connected and mechanically bonded to each other via bump 15.

Semiconductor apparatus 1 of the present embodiment may comprise first bonding portion 26 bonding supporting member 20 to second substrate 10. First bonding portion 26 reinforces electrical connection and mechanical bonding between first pad 30 and interconnect 12 via bump 15. According to semiconductor apparatus 1 of the present embodiment, first pad 30 and interconnect 12 can be steadily, electrically connected and mechanically bonded to each other via bump 15.

Semiconductor apparatus 1 of the present embodiment may further comprise insulating layer 28 between first pad 30 and supporting member 20. Insulating layer 28 electrically insulates first pad 30 from supporting member 20. Semiconductor apparatus 1 of the present embodiment can prevent semiconductor device 7 electrically connected to first pad 30 from being electrically destroyed.

In semiconductor apparatus 1 of the present embodiment, supporting member 20 may have protrusion 21 protruding toward second substrate 10. Height h of protrusion 21 may be larger than thickness of first pad 30. Protrusion 21 prevents first pad 30 on supporting member 20 from colliding with second surface 14 of second substrate 10. Protrusion 21 ensures a space in which bump 15 is disposed between second surface 14 of second substrate 10 and first pad 30. According to semiconductor apparatus 1 of the present embodiment, first pad 30 and interconnect 12 can be steadily, electrically connected and mechanically bonded to each other via bump 15.

In semiconductor apparatus 1 of the present embodiment, semiconductor device 7 may be sealed by first substrate 5 and second substrate 10. Specifically, in semiconductor apparatus 1 of the present embodiment, second substrate 10 may be bonded to first substrate 5 via an anodic bonding portion or a surface activated bonding portion. First substrate 5 and second substrate 10 can protect semiconductor device 7 from the surrounding environment. Semiconductor apparatus 1 of the present embodiment has a long lifetime.

A method for manufacturing semiconductor apparatus 1 of the present embodiment comprises providing semiconductor device 7 on and/or in first surface 6 of first substrate 5, forming first flexible connecting member 33 electrically connected to semiconductor device 7, and forming above first surface 6 of first substrate 5 first pad 30 electrically and mechanically connected to first flexible connecting member 33. Forming first pad 30 comprises forming first pad 30 to have at least a portion overlapping semiconductor device 7 in the plan view seen in the direction along the normal to first surface 6. The method for manufacturing semiconductor apparatus 1 of the present embodiment comprises disposing second substrate 10 including bump 15 and interconnect 12 electrically connected to bump 15 so as to cover semiconductor device 7. Disposing second substrate 10 includes disposing second substrate 10 such that the second substrate 10 second surface 14 with bump 15 protruding therefrom faces first surface 6 of first substrate 5 and bump 15 has at least a portion overlapping first pad 30 in the plan view seen in the direction along the normal to first surface 6. Second substrate 10 is low-temperature sintered ceramic (LTCC) substrate 11 containing alkali metal ions. The method for manufacturing semiconductor apparatus 1 of the present embodiment further comprises applying heat and a first voltage to second substrate 10 to move first pad 30 toward second surface 14 to electrically connect and mechanically bond first pad 30 to interconnect 12 via bump 15.

In the method for manufacturing semiconductor apparatus 1 of the present embodiment, first flexible connecting member 33 electrically and mechanically connected to first pad 30 is formed. This allows first pad 30 and bump 15 to be disposed to allow first pad 30 to have at least a portion overlapping semiconductor device 7 and bump 15 to have at least a portion overlapping first pad 30 in the plan view seen in the direction along the normal to first surface 6 without preventing semiconductor device 7 from operating. The method for manufacturing semiconductor apparatus 1 of the present embodiment allows semiconductor apparatus 1 to be miniaturized even if first pad 30 is increased in size due to low positional accuracy of interconnect 12 and bump 15 of second substrate 10 that is low-temperature co-fired ceramic (LTCC) substrate 11.

According to the method for manufacturing semiconductor apparatus 1 of the present embodiment, first pad 30 can be increased in size in semiconductor apparatus 1 having a small size. This ensures that first pad 30 can be electrically connected and mechanically bonded to interconnect 12 via bump 15 regardless of low positional accuracy of interconnect 12 and bump 15 of second substrate 10 that is low-temperature co-fired ceramic (LTCC) substrate 11. The method for manufacturing semiconductor apparatus 1 of the present embodiment allows semiconductor apparatus 1 having a small size to be manufactured with high yield.

The method for manufacturing semiconductor apparatus 1 of the present embodiment may further comprise forming second flexible connecting members 22, 23, 24 mechanically connected to first surface 6, and forming above first surface 6 of first substrate 5 supporting member 20 mechanically connected to second flexible connecting members 22, 23, 24. Forming first pad 30 may comprise forming first pad 30 on supporting member 20. This allows first pad 30 and bump 15 to be disposed to allow first pad 30 to have at least a portion overlapping semiconductor device 7 and bump 15 to have at least a portion overlapping first pad 30 in the plan view seen in the direction along the normal to first surface 6 without preventing semiconductor device 7 from operating. The method for manufacturing semiconductor apparatus 1 of the present embodiment allows semiconductor apparatus 1 to be miniaturized.

Furthermore, in the method for manufacturing semiconductor apparatus 1 of the present embodiment, moving first pad 30 toward second surface 14 may comprise applying a second voltage different from the first voltage to supporting member 20 to move supporting member 20 toward second surface 14. While first pad 30 is moved toward second surface 14 by applying the first voltage and the second voltage to second substrate 10 and supporting member 20, respectively, first flexible connecting member 33 and second flexible connecting members 22, 23, 24 allow first pad 30 to have first main surface 31 steadily facing second surface 14 of second substrate 10. First pad 30 can be reliably bonded to bump 15 over a large area. According to the method for manufacturing semiconductor apparatus 1 of the present embodiment, first pad 30 and interconnect 12 can be steadily, electrically connected and mechanically bonded to each other via bump 15.

The method for manufacturing semiconductor apparatus 1 of the present embodiment may further comprise applying the second voltage to supporting member 20 to bond supporting member 20 to second substrate 10 via first bonding portion 26 that is an anodic bonding portion. First bonding portion 26 reinforces electrical connection and mechanical bonding between first pad 30 and interconnect 12 via bump 15. According to the method for manufacturing semiconductor apparatus 1 of the present embodiment, first pad 30 and interconnect 12 can be steadily, electrically connected and mechanically bonded to each other via bump 15.

The method for manufacturing semiconductor apparatus 1 of the present embodiment may further comprise forming insulating layer 28 on supporting member 20. Forming first pad 30 may comprise forming first pad 30 on insulating layer 28. Insulating layer 28 electrically insulates first pad 30 from supporting member 20. Insulating layer 28 can prevent the second voltage applied to supporting member 20 from being applied to semiconductor device 7 via first pad 30, first flexible connecting member 33, first fixing portion 35 and second pad 8. The method for manufacturing semiconductor apparatus 1 of the present embodiment can prevent semiconductor device 7 electrically connected to first pad 30 from being electrically destroyed when anodically bonding supporting member 20 to second substrate 10.

The method for manufacturing semiconductor apparatus 1 of the present embodiment may further comprise forming on supporting member 20 protrusion 21 protruding away from first surface 6. Height h of protrusion 21 may be larger than thickness t of first pad 30. When first pad 30 is moved toward second surface 14 by a first electrostatic attractive force between first charged layer 46 and second charged layer 47 and a second electrostatic attractive force between first charged layer 46 and third charged layer 48, protrusion 21 prevents first pad 30 on supporting member 20 from colliding with second surface 14 of second substrate 10. Protrusion 21 ensures a space in which bump 15 is disposed between second surface 14 of second substrate 10 and first pad 30. According to the method for manufacturing semiconductor apparatus 1 of the present embodiment, first pad 30 and interconnect 12 can be steadily, electrically connected and mechanically bonded to each other via bump 15.

The method for manufacturing semiconductor apparatus 1 of the present embodiment may further comprise sealing semiconductor device 7 by first substrate 5 and second substrate 10. In the method for manufacturing semiconductor apparatus 1 of the present embodiment, sealing semiconductor device 7 may comprise bonding second substrate 10 to first substrate 5 by anodic bonding or surface activated bonding. First substrate 5 and second substrate 10 can protect semiconductor device 7 from the surrounding environment. The method for manufacturing semiconductor apparatus 1 of the present embodiment allows semiconductor apparatus 1 to have a long life.

In the method for manufacturing semiconductor apparatus 1 of the present embodiment, sealing semiconductor device 7 may comprise applying the second voltage and the first voltage to first substrate 5 and second substrate 10, respectively, to anodically bond second substrate 10 to first substrate 5. In the method for manufacturing semiconductor apparatus 1 of the present embodiment, by a single step of applying the first voltage to second substrate 10 and applying the second voltage to first substrate 5 and supporting member 20, first pad 30 can be electrically connected and mechanically bonded to bump 15 and second substrate 10 can be anodically bonded to first substrate 5. The method for manufacturing semiconductor apparatus 1 of the present embodiment allows semiconductor apparatus 1 to be manufactured through a small number of steps.

Referring to FIG. 15, in a semiconductor apparatus 1a of a modification of the present embodiment and a method for manufacturing the same, instead of first bonding portion 26 that is an anodic bonding portion or a surface activated bonding portion, a first bonding portion 26a composed of a material which adheres to supporting member 20 and second substrate 10 may be used to bond supporting member 20 to second substrate 10. Specifically, first bonding portion 26a composed of a material which adheres to supporting member 20 and second substrate 10 may be used to bond protrusion 21 of supporting member 20 to second substrate 10. First bonding portion 26a composed of a material which adheres to supporting member 20 and second substrate 10 may be a eutectic bonding portion, or a bonding portion of an adhesive, solder or frit glass.

First bonding portion 26a composed of a material which adheres to supporting member 20 and second substrate 10 is formed on supporting member 20. Specifically, first bonding portion 26a composed of a material which adheres to supporting member 20 and second substrate 10 is formed on protrusion 21 of supporting member 20. When the first voltage and the second voltage are applied to second substrate 10 and supporting member 20, respectively, first pad 30 moves toward second surface 14. First bonding portion 26a contacts second surface 14 of second substrate 10. Supporting member 20 is bonded to second substrate 10 by using first bonding portion 26a composed of a material which adheres to supporting member 20 and second substrate 10. Specifically, supporting member 20 has protrusion 21 bonded to second surface 14 of second substrate 10 by using first bonding portion 26a composed of a material which adheres to supporting member 20 and second substrate 10.

Second Embodiment

Figure 17:
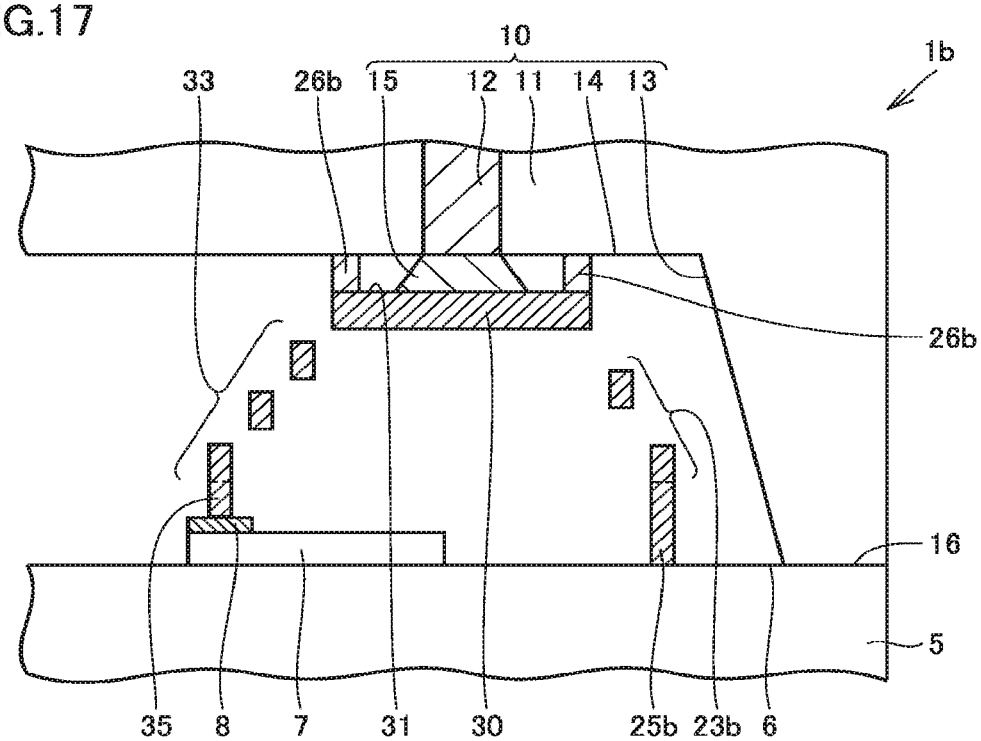
FIG. 17 is a schematic partial enlarged cross section of the semiconductor apparatus according to the second embodiment of the present invention at a region XVII shown in FIG. 16, and is a schematic cross section taken along a line XVII-XVII shown in FIG. 18.
Figure 18:
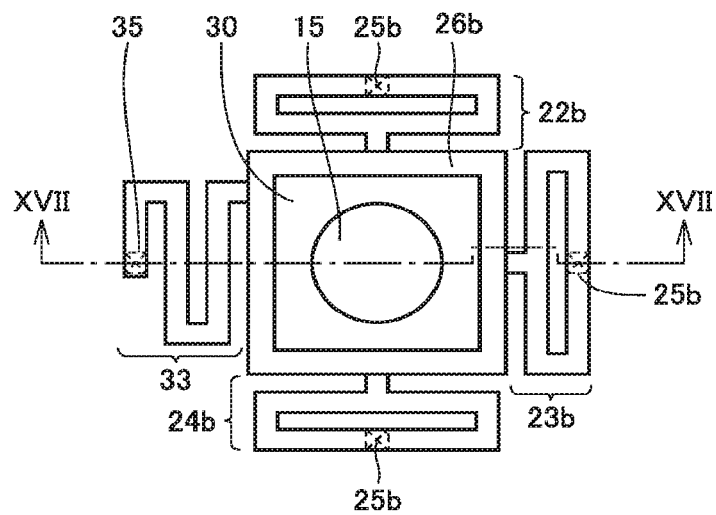
FIG. 18 is a schematic partial enlarged plan view of the semiconductor apparatus according to the second embodiment of the present invention.

With reference to FIGS. 16 to 18, a semiconductor apparatus 1b according to a second embodiment will be described. Semiconductor apparatus 1b of the present embodiment basically has the same configuration as semiconductor apparatus 1 of the first embodiment, except mainly for the following point:

Semiconductor apparatus 1b of the present embodiment does not comprise supporting member 20 and insulating layer 28 provided in semiconductor apparatus 1 of the first embodiment. Semiconductor apparatus 1b of the present embodiment does not comprise second flexible connecting members 22, 23, 24 provided in semiconductor apparatus 1 of the first embodiment, and instead comprises one or more third flexible connecting members 22b, 23b, 24b.

Third flexible connecting members 22b, 23b, 24b are mechanically connected to first pad 30 and first surface 6 of first substrate 5. Specifically, third flexible connecting members 22b, 23b, 24b may each be mechanically fixed to first surface 6 of first substrate 5 via a third fixing portion 25b. Third flexible connecting members 22b, 23b, 24b are separated from first surface 6 of first substrate 5 and second surface 14 of second substrate 10. Third flexible connecting members 22b, 23b, 24b are configured to be deformable with respect to first substrate 5 and second substrate 10.

Third flexible connecting members 22b, 23b, 24b may each be a third beam shaped in an elongate ring. Third flexible connecting members 22b, 23b, 24b may each be a third beam having a meandering shape. Third flexible connecting members 22b, 23b, 24b may each be a third beam composed of metal or a similar, electrically conductive material. Third flexible connecting members 22b, 23b, 24b may be composed of gold (Au), platinum (Pt), copper (Cu), or aluminum (Al), for example. Third flexible connecting members 22b, 23b, 24b may be composed of a material identical to a material of first pad 30.

Third fixing portion 25b may be integrated with third flexible connecting members 22b, 23b, 24b. Third fixing portion 25b may be composed of metal or a similar, electrically conductive material. Third fixing portion 25b may be composed for example of gold (Au), platinum (Pt), copper (Cu) or aluminum (Al). Third fixing portion 25b may be composed of a material identical to a material of third flexible connecting members 22b, 23b, 24b. Third fixing portion 25b may be composed of a material identical to a material of third flexible connecting members 22b, 23b, 24b.

First pad 30 is mechanically connected not only to first flexible connecting member 33 but also to third flexible connecting members 22b, 23b, 24b. Third flexible connecting members 22b, 23b, 24b may be integrated with first pad 30. First pad 30, third flexible connecting members 22b, 23b, 24b, and third fixing portion 25b are composed of an electrically conductive material, and first pad 30, third flexible connecting members 22b, 23b, 24b and third fixing portion 25b may be electrically connected to first substrate 5. First pad 30 may be composed of a material identical to a material of third flexible connecting members 22b, 23b, 24b. First pad 30, third flexible connecting members 22b, 23b, 24b and third fixing portion 25b may be integrated together. First pad 30 may be composed of a material identical to a material of third flexible connecting members 22b, 23b, 24b and third fixing portion 25b.

As shown in FIG. 18, first pad 30 may be mechanically connected at mutually different locations to first flexible connecting member 33 and one or more of third flexible connecting members 22b, 23b, 24b, respectively. In a plan view seen in a direction in which first substrate 5 and second substrate 10 overlap, first pad 30 may be located between first flexible connecting member 33 and third flexible connecting member 23b. In the plan view seen in the direction in which first substrate 5 and second substrate 10 overlap, first pad 30 may be located between third flexible connecting member 22b and third flexible connecting member 24b.

Semiconductor apparatus 1b of the present embodiment may not comprise first bonding portion 26 of semiconductor apparatus 1 of the first embodiment and may instead include a second bonding portion 26b bonding first pad 30 to second substrate 10. First pad 30 may be bonded to second substrate 10 via second bonding portion 26b. Second bonding portion 26b reinforces electrical connection and mechanical bonding between first pad 30 and interconnect 12 via bump 15. Second bonding portion 26b prevents first pad 30 from colliding with second surface 14 of second substrate 10. Second bonding portion 26b ensures a space in which bump 15 is disposed between second surface 14 of second substrate 10 and first pad 30. Specifically, second bonding portion 26b may be disposed between second surface 14 of second substrate 10 and first pad 30 so as to surround bump 15. Second bonding portion 26b is composed of a material which adheres to first pad 30 and second substrate 10, such as gold (Au) or a resin such as polyimide.

With reference to FIGS. 5 and 19 to 24, a method for manufacturing semiconductor apparatus 1b of the present embodiment will be described.

Referring to FIG. 5, the method for manufacturing semiconductor apparatus 1b of the present embodiment comprises providing semiconductor device 7 on and/or in first surface 6 of first substrate 5, and forming second pad 8 electrically connected to semiconductor device 7.

Figure 19:
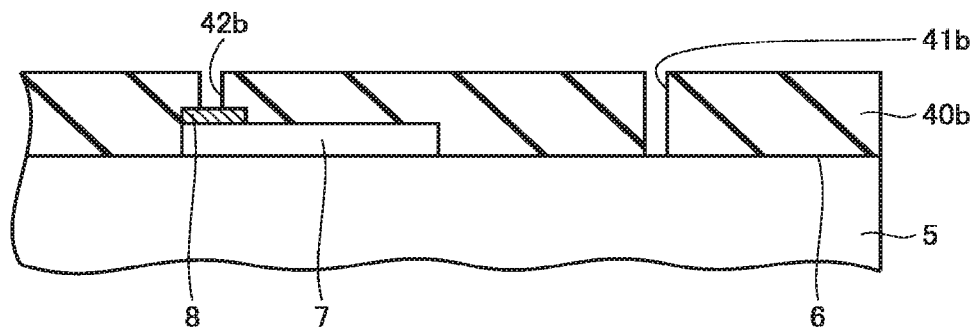
FIG. 19 is a schematic partial enlarged cross section in a method for manufacturing a semiconductor apparatus according to the second and third embodiments of the present invention at a step subsequent to the step shown in FIG. 5.

Referring to FIG. 19, the method for manufacturing semiconductor apparatus 1b of the present embodiment may comprise forming a sacrificial layer 40b on first surface 6 of first substrate 5. Specifically, sacrificial layer 40b may be formed on semiconductor device 7, second pad 8, and first surface 6 of first substrate 5 exposed from semiconductor device 7 and second pad 8. Sacrificial layer 40b may be formed so that a surface of sacrificial layer 40b facing away from first surface 6 of first substrate 5 is flat. Sacrificial layer 40b may be composed for example of silicon dioxide.

Then, the method for manufacturing semiconductor apparatus 1b of the present embodiment may comprise forming a first through hole 41b through sacrificial layer 40b to expose a portion of first surface 6 of first substrate 5, and a second through hole 42b through sacrificial layer 40b to expose a portion of second pad 8. For example, first through hole 41b and second through hole 42b may be formed through photolithography.

Figure 20:
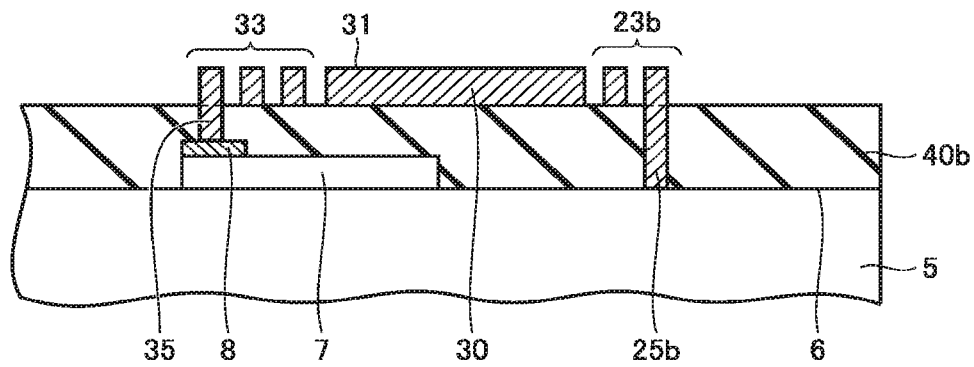
FIG. 20 is a schematic partial enlarged cross section in the method for manufacturing the semiconductor apparatus according to the second and third embodiments of the present invention at a step subsequent to the step shown in FIG. 19.
Figure 21:
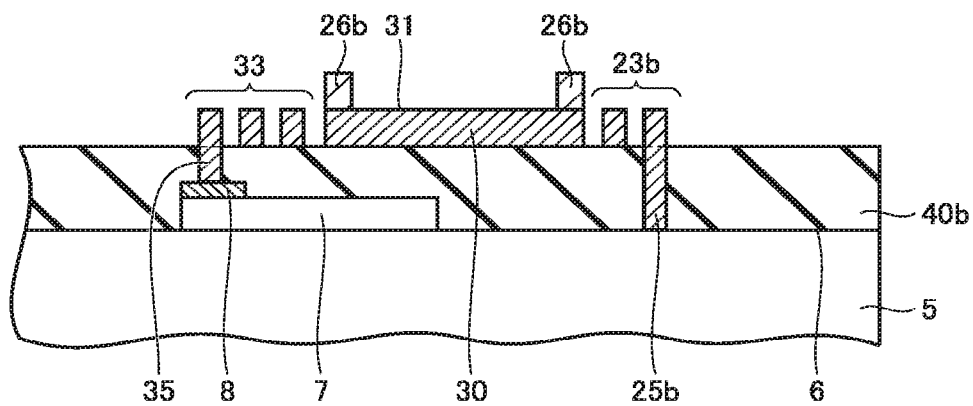
FIG. 21 is a schematic partial enlarged cross section in the method for manufacturing the semiconductor apparatus according to the second embodiment of the present invention at a step subsequent to the step shown in FIG. 20.
Figure 22:
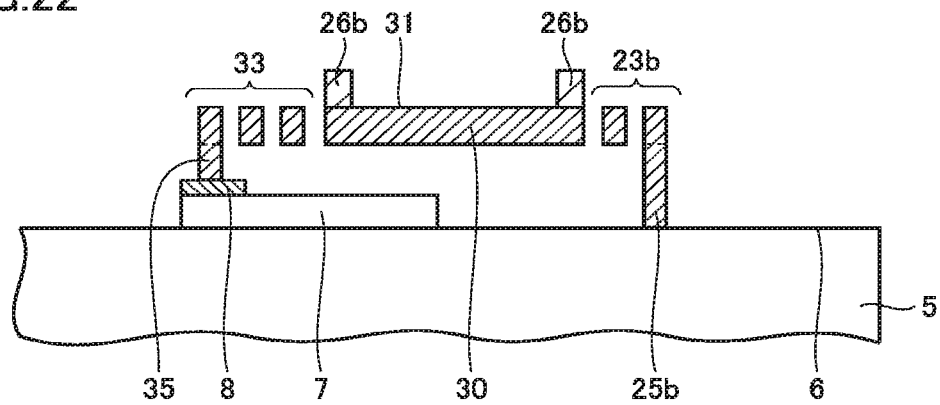
FIG. 22 is a schematic partial enlarged cross section in the method for manufacturing the semiconductor apparatus according to the second embodiment of the present invention at a step subsequent to the step shown in FIG. 21.

With reference to FIGS. 20 to 22, the method for manufacturing semiconductor apparatus 1b of the present embodiment comprises forming first flexible connecting member 33 electrically connected to semiconductor device 7, and forming above first surface 6 of first substrate 5 first pad 30 electrically and mechanically connected to first flexible connecting member 33. First pad 30 has at least a portion overlapping semiconductor device 7 in the plan view seen in the direction along the normal to first surface 6. Specifically, forming first flexible connecting member 33 electrically connected to semiconductor device 7 may comprise forming second pad 8 electrically connected to semiconductor device 7, and forming first fixing portion 35 electrically connecting and mechanically fixing first flexible connecting member 33 to second pad 8.

The method for manufacturing semiconductor apparatus 1b of the present embodiment may further comprise forming third flexible connecting members 22b, 23b, 24b mechanically connected to first pad 30 and first surface 6 of first substrate 5. Specifically, forming third flexible connecting members 22b, 23b, 24b may comprise forming third fixing portion 25b mechanically fixing third flexible connecting members 22b, 23b, 24b to first surface 6 of first substrate 5. Specifically, third flexible connecting members 22b, 23b, 24b may electrically connect first pad 30 to first substrate 5. More specifically, third flexible connecting members 22b, 23b, 24b and third fixing portion 25b may electrically connect first pad 30 to first substrate 5.

Specifically, referring to FIG. 20, the method for manufacturing semiconductor apparatus 1b of the present embodiment comprises forming first pad 30, first flexible connecting member 33, first fixing portion 35, third flexible connecting members 22b, 23b, 24b, and a third fixing portion 25b on sacrificial layer 40b. First pad 30 is formed to have at least a portion overlapping semiconductor device 7 in the plan view seen in the direction along the normal to first surface 6. First pad 30 has first main surface 31 facing away from first substrate 5. More specifically, a metal film is formed on sacrificial layer 40b. The metal film is filled in first through hole 41b and second through hole 42b. The metal film is preferably composed of gold (Au). Photolithography or the like is employed to pattern the metal film. In this manner, first pad 30, first flexible connecting member 33, first fixing portion 35, third flexible connecting members 22b, 23b, 24b, and third fixing portion 25b may be formed in the same process.

Referring to FIG. 21, the method for manufacturing semiconductor apparatus 1b of the present embodiment comprises forming second bonding portion 26b on first pad 30. Specifically, second bonding portion 26b is formed on first main surface 31 of first pad 30. More specifically, second bonding portion 26b may be formed on a peripheral portion of first main surface 31 of first pad 30. Second bonding portion 26b is composed of a material which adheres to first pad 30 and second substrate 10, such as gold (Au) or a resin such as polyimide.

Referring to FIG. 22, the method for manufacturing semiconductor apparatus 1b of the present embodiment may comprise selectively removing sacrificial layer 40b. The method for selectively removing sacrificial layer 40b in the method for manufacturing semiconductor apparatus 1b of the present embodiment is the same as the method for selectively removing sacrificial layer 40 in the method for manufacturing semiconductor apparatus 1 of the first embodiment. First pad 30, first flexible connecting member 33, and third flexible connecting members 22b, 23b, 24b may be spaced from first surface 6 of first substrate 5 in a single step of selectively removing sacrificial layer 40b. Thus, the method for manufacturing semiconductor apparatus 1b of the present embodiment may comprise forming first flexible connecting member 33 deformable with respect to first substrate 5. Thus, the method for manufacturing semiconductor apparatus 1b of the present embodiment may comprise forming third flexible connecting members 22b, 23b, 24b deformable with respect to first substrate 5. The method for manufacturing semiconductor apparatus 1b of the present embodiment may comprise forming first pad 30 displaceable with respect to first substrate 5.

Figure 23:
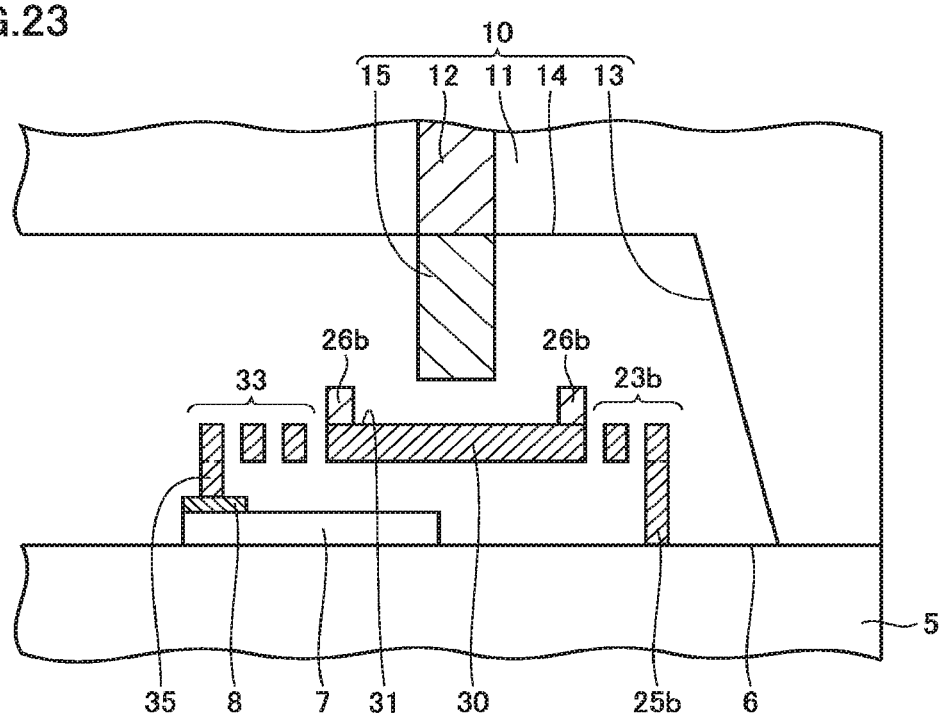
FIG. 23 is a schematic partial enlarged cross section in the method for manufacturing the semiconductor apparatus according to the second embodiment of the present invention at a step subsequent to the step shown in FIG. 22.

Referring to FIG. 23, the method for manufacturing semiconductor apparatus 1b of the present embodiment comprises disposing second substrate 10 including bump 15 and interconnect 12 electrically connected to bump 15 so as to cover semiconductor device 7. Disposing second substrate 10 includes disposing second substrate 10 such that the second substrate 10 second surface 14 with bump 15 protruding therefrom faces first surface 6 of first substrate 5 and bump 15 has at least a portion overlapping first pad 30 in the plan view seen in the direction along the normal to first surface 6. Specifically, second substrate 10 may be disposed such that second surface 14 of second substrate 10 faces first main surface 31 of first pad 30. Specifically, the entire bump 15 may overlap first pad 30 in the plan view seen in the direction along the normal to first surface 6. Bump 15 may have at least a portion overlapping semiconductor device 7 in the plan view seen in the direction along the normal to first surface 6. Second substrate 10 is low-temperature sintered ceramic (LTCC) substrate 11 containing alkali metal ions.

Figure 24:
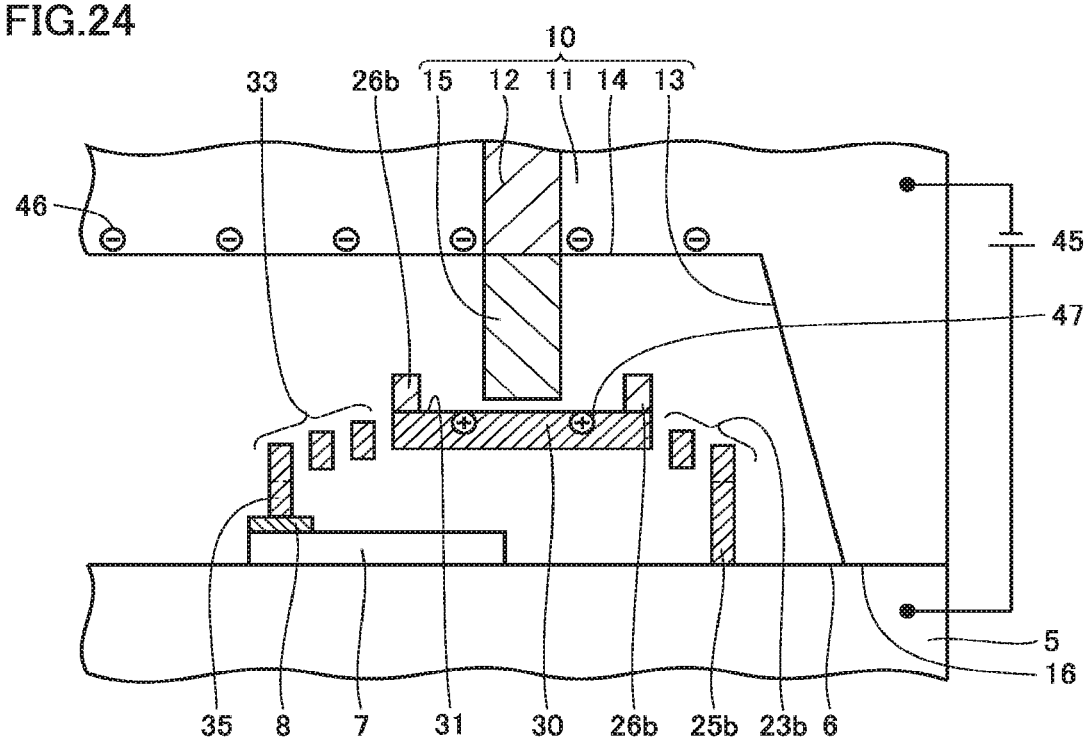
FIG. 24 is a schematic partial enlarged cross section in the method for manufacturing the semiconductor apparatus according to the second embodiment of the present invention at a step subsequent to the step shown in FIG. 23.

Referring to FIG. 24, the method for manufacturing semiconductor apparatus 1b of the present embodiment comprises applying heat and a first voltage to second substrate 10 to move first pad 30 toward second surface 14 to electrically connect and mechanically bond first pad 30 to interconnect 12 via bump 15.

Specifically, first substrate 5 and second substrate 10 are heated. First substrate 5 and second substrate 10 may be heated to have a temperature of 100° C. or higher and 500° C. or lower, preferably 200° C. or higher and 400° C. or lower. Heating second substrate 10 helps alkali metal ions in second substrate 10, or LTCC substrate 11, to move.

The first voltage is applied to second substrate 10. A second voltage different from the first voltage is applied to first pad 30. Specifically, when first pad 30 is electrically connected to first substrate 5 via third flexible connecting members 22b, 23b, 24b and third fixing portion 25b, power supply 45 may be connected to first substrate 5 to apply the second voltage to first pad 30 via first substrate 5. Specifically, the second voltage may be larger than the first voltage. For example, first substrate 5 is connected to the positive electrode of power supply 45, and second substrate 10 is connected to the negative electrode of power supply 45. Power supply 45 is a DC power supply. The first voltage may be applied to second substrate 10 via a dummy glass substrate (not shown) disposed on second substrate 10.

When power supply 45 is used to apply the first voltage and the second voltage to second substrate 10 and first pad 30, respectively, the alkali metal ions in second substrate 10 move from second surface 14 toward the negative electrode of power supply 45. In second surface 14 of second substrate 10, first charged layer 46, which is a layer depleted of alkali metal ions, is formed. In second substrate 10 before the first voltage is applied thereto, alkali metal ions exist with their charges in balance with those of negative ions such as oxygen ions. The negative ions are less mobile than the alkali metal ions. First charged layer 46 is composed of negative ions left behind by applying the first voltage. First charged layer 46 is a negatively charged layer. Through electrostatic induction, first charged layer 46 induces second charged layer 47 opposite in polarity to first charged layer 46 in first main surface 31 of first pad 30 facing second surface 14. Second charged layer 47 is a positively charged layer. An electrostatic attractive force is generated between first charged layer 46 and second charged layer 47 opposite in polarity to first charged layer 46.

Since first pad 30 is mechanically connected to first flexible connecting member 33 and third flexible connecting members 22b, 23b, 24b, first pad 30 is configured to be displaceable with respect to first substrate 5 and second substrate 10. The electrostatic attractive force causes first pad 30 to move toward second surface 14. First pad 30 contacts bump 15 protruding from second surface 14. First pad 30 may crush bump 15. First pad 30 is thus electrically connected and mechanically bonded to interconnect 12 via bump 15.

Referring to FIG. 24, the method for manufacturing semiconductor apparatus 1b of the present embodiment may further comprise applying the first voltage and the second voltage to second substrate 10 and first pad 30, respectively, to move first pad 30 toward second surface 14 to bond first pad 30 to second substrate 10 via second bonding portion 26b. When the first voltage and the second voltage are applied to second substrate 10 and first pad 30, respectively, an electrostatic attractive force is generated between first charged layer 46 and second charged layer 47. This electrostatic attractive force moves first pad 30 toward second surface 14 and brings second bonding portion 26b on first pad 30 into contact with second surface 14 of second substrate 10. Second bonding portion 26b is composed of a material which adheres to first pad 30 and second substrate 10. Accordingly, first pad 30 is mechanically bonded to second surface 14 of second substrate 10 via second bonding portion 26b. By this electrostatic attractive force, second bonding portion 26b on first pad 30 may be thermocompression-bonded to second surface 14 of second substrate 10.

Second bonding portion 26b prevents first pad 30 from colliding with second surface 14 of second substrate 10. Second bonding portion 26b ensures a space in which bump 15 is disposed between second surface 14 of second substrate 10 and first pad 30. In the present embodiment, rather than an anodic bonding portion, second bonding portion 26b composed of a material which adheres to first pad 30 and second substrate 10 is used to bond first pad 30 to second substrate 10. Accordingly, the absolute value of the difference between the first voltage applied to second substrate 10 and the second voltage applied to first pad 30 in the method for manufacturing semiconductor apparatus 1b of the present embodiment may be smaller than the absolute value of the difference between the first voltage applied to second substrate 10 and the second voltage applied to supporting member 20 in the method for manufacturing semiconductor apparatus 1 of the first embodiment.

Referring to FIG. 24, the method for manufacturing semiconductor apparatus 1b of the present embodiment may further comprise sealing semiconductor device 7 by first substrate 5 and second substrate 10. The method for sealing semiconductor device 7 in the method for manufacturing semiconductor apparatus 1b of the present embodiment is the same as the method for sealing semiconductor device 7 in the method for manufacturing semiconductor apparatus 1 of the first embodiment.

An effect of semiconductor apparatus 1b of the present embodiment will now be described. Semiconductor apparatus 1b of the present embodiment basically has an effect similar to that of semiconductor apparatus 1 of the first embodiment, except for the following point:

Semiconductor apparatus 1b of the present embodiment may further comprise third flexible connecting members 22b, 23b, 24b mechanically connected to first pad 30 and first surface 6 of first substrate 5. First pad 30 is mechanically connected to first flexible connecting member 33 and in addition thereto third flexible connecting members 22b, 23b, 24b. This allows first pad 30 and bump 15 to be disposed to allow first pad 30 to have at least a portion overlapping semiconductor device 7 and bump 15 to have at least a portion overlapping first pad 30 in the plan view seen in the direction along the normal to first surface 6 without preventing semiconductor device 7 from operating. Semiconductor apparatus 1b of the present embodiment can be miniaturized even if first pad 30 is increased in size due to low positional accuracy of interconnect 12 and bump 15 of second substrate 10 that is low-temperature co-fired ceramic (LTCC) substrate 11.

Furthermore, first flexible connecting member 33 and third flexible connecting members 22b, 23b, 24b allow first pad 30 to have first main surface 31 steadily facing second surface 14. First pad 30 can be reliably bonded to bump 15 over a large area. According to semiconductor apparatus 1b of the present embodiment, first pad 30 and interconnect 12 can be steadily, electrically connected and mechanically bonded to each other via bump 15.

Semiconductor apparatus 1b of the present embodiment may further comprise second bonding portion 26b bonding first pad 30 to second substrate 10. Second bonding portion 26b reinforces electrical connection and mechanical bonding between first pad 30 and interconnect 12 via bump 15. According to semiconductor apparatus 1b of the present embodiment, first pad 30 and interconnect 12 can be steadily, electrically connected and mechanically bonded to each other.

The method for manufacturing semiconductor apparatus 1b of the present embodiment may further comprise forming third flexible connecting members 22b, 23b, 24b mechanically connected to first pad 30 and first surface 6 of first substrate 5. This allows first pad 30 and bump 15 to be disposed to allow first pad 30 to have at least a portion overlapping semiconductor device 7 and bump 15 to have at least a portion overlapping first pad 30 in the plan view seen in the direction along the normal to first surface 6 without preventing semiconductor device 7 from operating. The method for manufacturing semiconductor apparatus 1b of the present embodiment allows semiconductor apparatus 1b to be miniaturized even if first pad 30 is increased in size due to low positional accuracy of interconnect 12 and bump 15 of second substrate 10 that is low-temperature co-fired ceramic (LTCC) substrate 11.

Furthermore, in the method for manufacturing semiconductor apparatus 1b of the present embodiment, moving first pad 30 toward second surface 14 may comprise applying a second voltage different from the first voltage to first pad 30. While first pad 30 is moved toward second surface 14 by applying the first voltage and the second voltage to second substrate 10 and first pad 30, respectively, first flexible connecting member 33 and third flexible connecting members 22b, 23b, 24b allow first pad 30 to have first main surface 31 steadily facing second surface 14 of second substrate 10. First pad 30 can be reliably bonded to bump 15 over a large area. According to the method for manufacturing semiconductor apparatus 1b of the present embodiment, first pad 30 and interconnect 12 can be steadily, electrically connected and mechanically bonded together.

In the method for manufacturing semiconductor apparatus 1b of the present embodiment, third flexible connecting members 22b, 23b, 24b may be electrically connected to first substrate 5. In the method for manufacturing semiconductor apparatus 1b of the present embodiment, applying the second voltage to first pad 30 may comprise applying the second voltage to first pad 30 via first substrate 5. By applying the second voltage to first pad 30 via first substrate 5, the second voltage can be easily applied to first pad 30.

The method for manufacturing semiconductor apparatus 1b of the present embodiment may comprise forming second bonding portion 26b on either one of first pad 30 and second surface 14 of second substrate 10, and applying heat and the first voltage to second substrate 10 to move first pad 30 toward second surface 14 to bond first pad 30 to second substrate 10 via second bonding portion 26b. Second bonding portion 26b reinforces electrical connection and mechanical bonding between first pad 30 and interconnect 12 via bump 15. According to the method for manufacturing semiconductor apparatus 1b of the present embodiment, first pad 30 and interconnect 12 can be steadily, electrically connected and mechanically bonded to each other.

Figure 25:
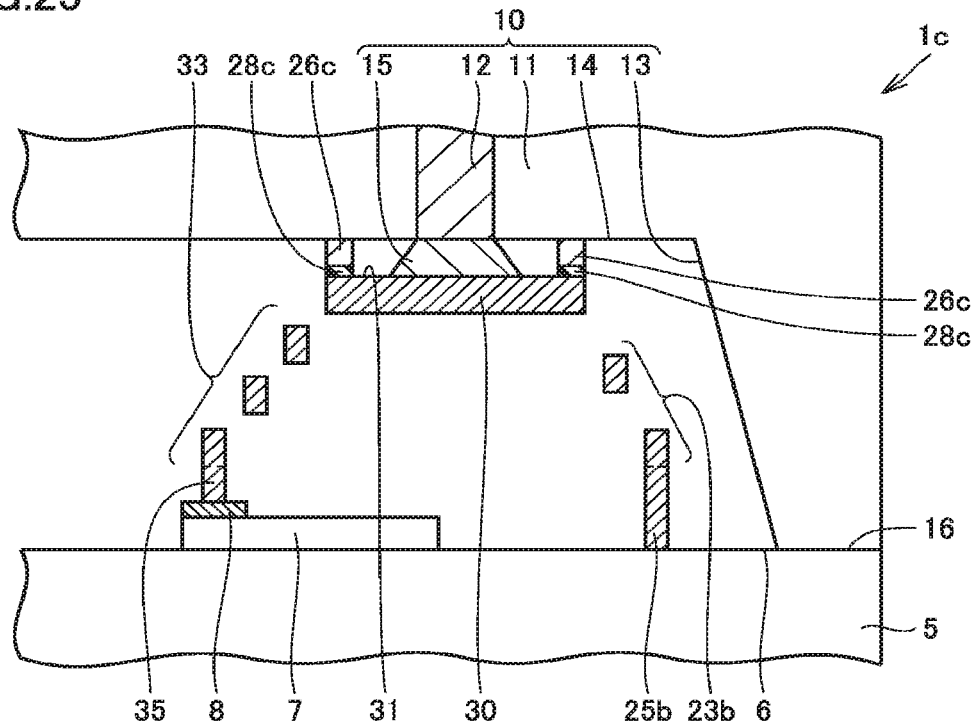
FIG. 25 is a schematic partial enlarged cross section of a semiconductor apparatus according to a modification of the second embodiment of the present invention.

Referring to FIG. 25, in a semiconductor apparatus 1c according to a modification of the present embodiment, and a method for manufacturing the same, rather than second bonding portion 26b composed of a material which adheres to first pad 30 and second substrate 10, a second bonding portion 26c which is an anodic bonding portion or a surface activated bonding portion may be used to bond first pad 30 to second substrate 10. By referring to an example with second bonding portion 26c being an anodic bonding portion, semiconductor apparatus 1c of a modification of the present embodiment and the method for manufacturing the same will be described below.

Second bonding portion 26c may be composed of a material that can be anodically bonded to second substrate 10, such as polysilicon, amorphous silicon or aluminum. Second bonding portion 26c is formed on first pad 30. When heat and the first voltage are applied to second substrate 10, first pad 30 moves toward second surface 14. Second bonding portion 26c contacts second surface 14 of second substrate 10. Since second bonding portion 26c is composed of a material that can be anodically bonded to second substrate 10, second bonding portion 26c is anodically bonded to second surface 14 of second substrate 10.

An insulating layer 28c may be disposed between second bonding portion 26c and first pad 30. Insulating layer 28c may be composed for example of silicon nitride or silicon dioxide. Insulating layer 28c electrically insulates first pad 30 from second bonding portion 26c. Insulating layer 28c prevents a voltage applied between second substrate 10 and second bonding portion 26c in order to anodically bond second bonding portion 26c to second substrate 10 from being applied to semiconductor device 7 via first pad 30, first flexible connecting member 33, first fixing portion 35 and second pad 8 and can thus prevent semiconductor device 7 from being destroyed. Semiconductor apparatus 1c of a modification of the present embodiment and the method for manufacturing the same more reliably prevent semiconductor device 7 electrically connected to first pad 30 from being electrically destroyed.

Third Embodiment

With reference to FIGS. 5, 19, 20, and 26 to 29, a method for manufacturing semiconductor apparatus 1c of the present embodiment (see FIGS. 16-18) will be described. The method for manufacturing semiconductor apparatus 1c of the present embodiment comprises a process similar to that of the method for manufacturing semiconductor apparatus 1b of the second embodiment, except mainly for the following point:

The method for manufacturing semiconductor apparatus 1b of the present embodiment, as well as the method for manufacturing semiconductor apparatus 1b of the second embodiment, comprises the steps shown in FIGS. 5, 19, and 20.

Figure 26:
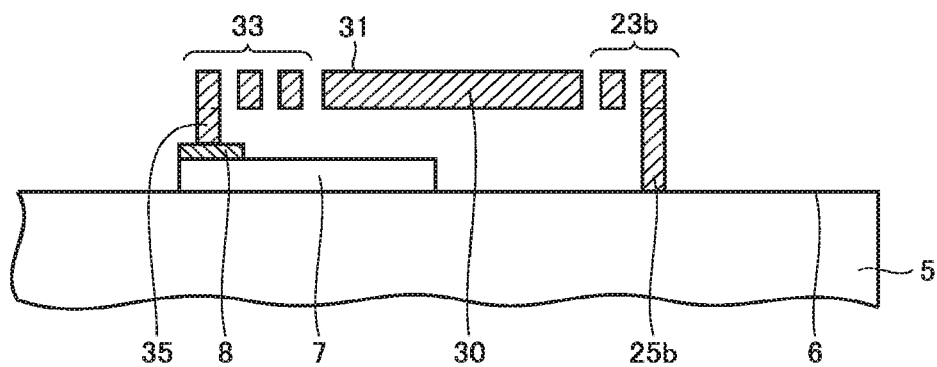
FIG. 26 is a schematic partial enlarged cross section in the method for manufacturing the semiconductor apparatus according to the third embodiment of the present invention at a step subsequent to the step shown in FIG. 20.

Referring to FIG. 26, the method for manufacturing semiconductor apparatus 1b of the present embodiment may comprise selectively removing sacrificial layer 40b. First pad 30, first flexible connecting member 33, and third flexible connecting members 22b, 23b, 24b may be spaced from first surface 6 of first substrate 5 in a single step of selectively removing sacrificial layer 40b. Thus, the method for manufacturing semiconductor apparatus 1b of the present embodiment may comprise forming first flexible connecting member 33 deformable with respect to first substrate 5. Thus, the method for manufacturing semiconductor apparatus 1b of the present embodiment may comprise forming third flexible connecting members 22b, 23b, 24b deformable with respect to first substrate 5. The method for manufacturing semiconductor apparatus 1b of the present embodiment may comprise forming first pad 30 displaceable with respect to first substrate 5. The method for selectively removing sacrificial layer 40b in the method for manufacturing semiconductor apparatus 1b of the present embodiment is the same as the method for selectively removing sacrificial layer 40b in the method for manufacturing semiconductor apparatus 1b of the second embodiment.

Figure 27:
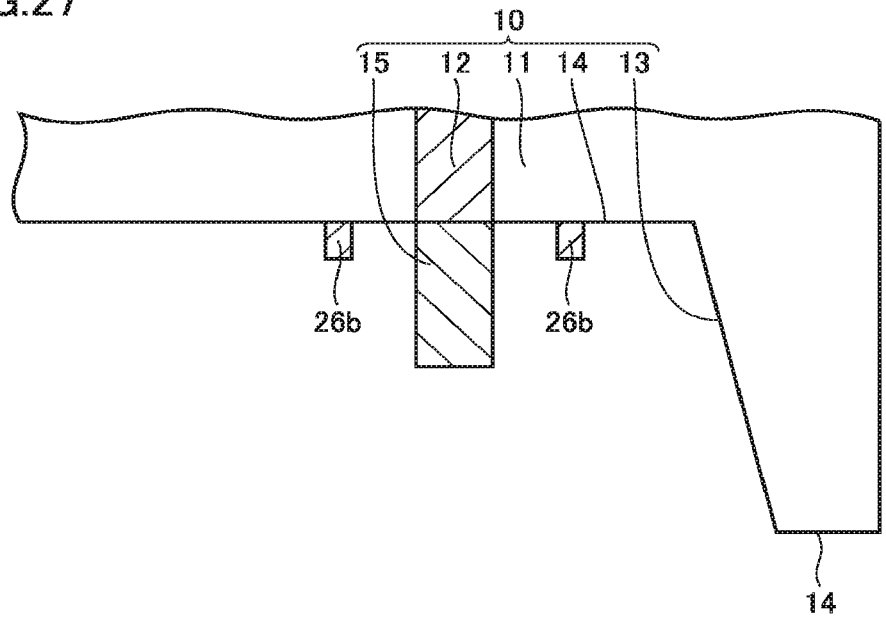
FIG. 27 is a schematic partial enlarged cross section in the method for manufacturing the semiconductor apparatus according to the third embodiment of the present invention at a step of a process of preparing a second substrate.

Referring to FIG. 27, the method for manufacturing semiconductor apparatus 1b of the present embodiment comprises forming second bonding portion 26b on second surface 14 of second substrate 10 shown in FIG. 12. Specifically, second bonding portion 26b may be disposed on second surface 14 of second substrate 10 so as to surround bump 15. Second bonding portion 26b may be composed of a material which adheres to first pad 30 and second substrate 10, such as gold (Au) or a resin such as polyimide.

Figure 28:
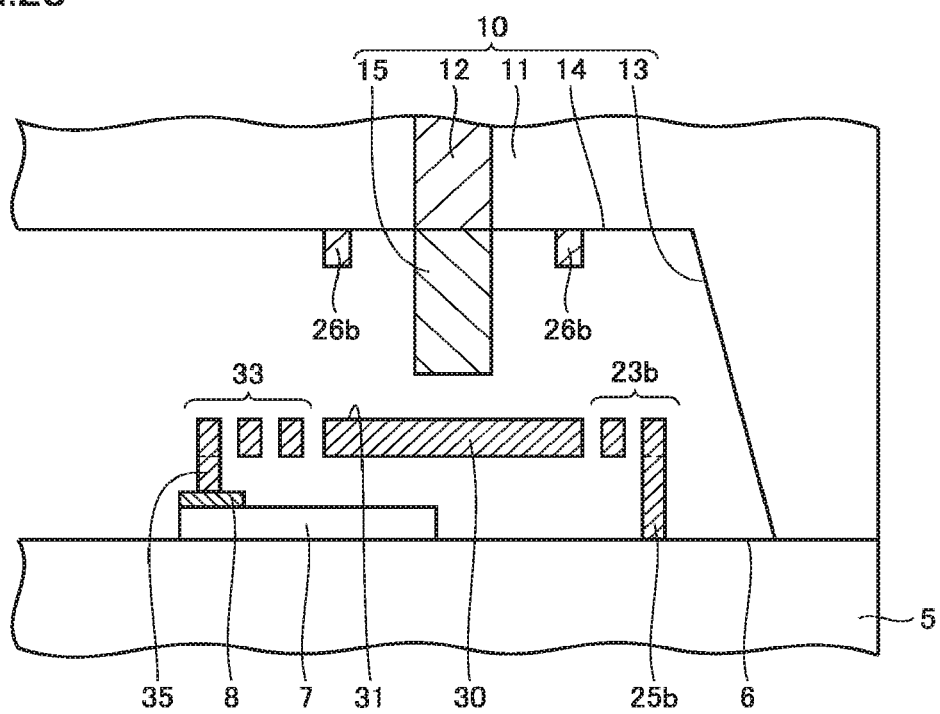
FIG. 28 is a schematic partial enlarged cross section in the method for manufacturing the semiconductor apparatus according to the third embodiment of the present invention at a step subsequent to the steps shown in FIGS. 26 and 27.

Referring to FIG. 28, the method for manufacturing semiconductor apparatus 1b of the present embodiment comprises disposing second substrate 10 including bump 15 and interconnect 12 electrically connected to bump 15 so as to cover semiconductor device 7. Disposing second substrate 10 includes disposing second substrate 10 such that the second substrate 10 second surface 14 with bump 15 protruding therefrom faces first surface 6 of first substrate 5 and bump 15 has at least a portion overlapping first pad 30 in the plan view seen in the direction along the normal to first surface 6. Specifically, second substrate 10 may be disposed such that second surface 14 of second substrate 10 faces first main surface 31 of first pad 30. Specifically, the entire bump 15 may overlap first pad 30 in the plan view seen in the direction along the normal to first surface 6. Bump 15 may have at least a portion overlapping semiconductor device 7 in the plan view seen in the direction along the normal to first surface 6. Second substrate 10 is low-temperature sintered ceramic (LTCC) substrate 11 containing alkali metal ions.

Figure 29:
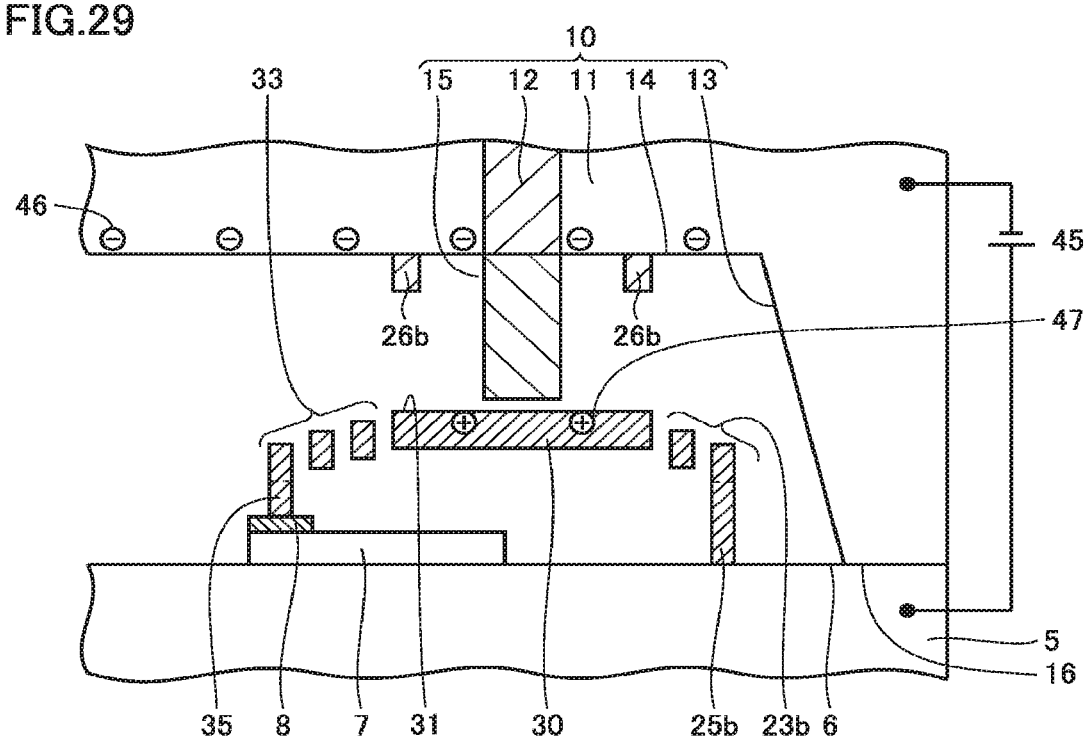
FIG. 29 is a schematic partial enlarged cross section in the method for manufacturing the semiconductor apparatus according to the third embodiment of the present invention at a step subsequent to the step shown in FIG. 28.

Referring to FIG. 29, the method for manufacturing semiconductor apparatus 1b of the present embodiment comprises applying heat and a first voltage to second substrate 10 to move first pad 30 toward second surface 14 to electrically connect and mechanically bond first pad 30 to interconnect 12 via bump 15. Electrically connecting and mechanically bonding first pad 30 to bump 15 in the method for manufacturing semiconductor apparatus 1b of the present embodiment is similar to electrically connecting and mechanically bonding first pad 30 to bump 15 in the method for manufacturing semiconductor apparatus 1b of the second embodiment.

Referring to FIG. 29, the method for manufacturing semiconductor apparatus 1b of the present embodiment may further comprise applying the first voltage and the second voltage to second substrate 10 and first pad 30, respectively, to move first pad 30 toward second surface 14 to bond first pad 30 to second substrate 10 via second bonding portion 26b. Specifically, power supply 45 may be connected to second substrate 10 and the second voltage may be applied to first pad 30 via first substrate 5. When the first voltage and the second voltage are applied to second substrate 10 and first pad 30, respectively, first charged layer 46 is formed in second surface 14 of second substrate 10. Electrostatic induction induces second charged layer 47 opposite in polarity to first charged layer 46 in first main surface 31 of first pad 30 facing second surface 14. An electrostatic attractive force is generated between first charged layer 46 and second charged layer 47.

This electrostatic attractive force moves first pad 30 towards second surface 14 and brings first pad 30 into contact with second bonding portion 26b on second surface 14 of second substrate 10. Second bonding portion 26b is composed of a material which adheres to first pad 30 and second substrate 10. Accordingly, first pad 30 is bonded to second surface 14 of second substrate 10 via second bonding portion 26b. By this electrostatic attractive force, second bonding portion 26b on second surface 14 of second substrate 10 may be thermocompression-bonded to first pad 30.

Second bonding portion 26b prevents first pad 30 from colliding with second surface 14 of second substrate 10. Second bonding portion 26b ensures a space in which bump 15 is disposed between second surface 14 of second substrate 10 and first pad 30. In the present embodiment, rather than an anodic bonding portion, second bonding portion 26b composed of a material which adheres to first pad 30 and second substrate 10 is used to bond first pad 30 to second substrate 10. Accordingly, the absolute value of the difference between the first voltage applied to second substrate 10 and the second voltage applied to first pad 30 in the method for manufacturing semiconductor apparatus 1b of the present embodiment may be smaller than the absolute value of the difference between the first voltage applied to second substrate 10 and the second voltage applied to supporting member 20 in the method for manufacturing semiconductor apparatus 1 of the first embodiment.

Referring to FIG. 29, the method for manufacturing semiconductor apparatus 1b of the present embodiment may further comprise sealing semiconductor device 7 by first substrate 5 and second substrate 10. The method for sealing semiconductor device 7 in the method for manufacturing semiconductor apparatus 1b of the present embodiment is the same as the method for sealing semiconductor device 7 in the method for manufacturing semiconductor apparatuses 1 and 1b of the first and second embodiments.

An effect of the method for manufacturing semiconductor apparatus 1b of the present embodiment and will now be described. The method for manufacturing semiconductor apparatus 1b of the present embodiment basically has an effect similar to that of the method for manufacturing semiconductor apparatus 1b of the second embodiment, except for the following point:

The method for manufacturing semiconductor apparatus 1b of the present embodiment comprises forming second bonding portion 26b second surface 14 of second substrate 10, and applying heat and the first voltage to second substrate 10 to move first pad 30 toward second surface 14 to bond first pad 30 to second substrate 10 via second bonding portion 26b. Second bonding portion 26b reinforces electrical connection and mechanical bonding between first pad 30 and interconnect 12 via bump 15. According to the method for manufacturing semiconductor apparatus 1b of the present embodiment, first pad 30 and interconnect 12 can be steadily, electrically connected and mechanically bonded to each other.

Fourth Embodiment

Figure 30:
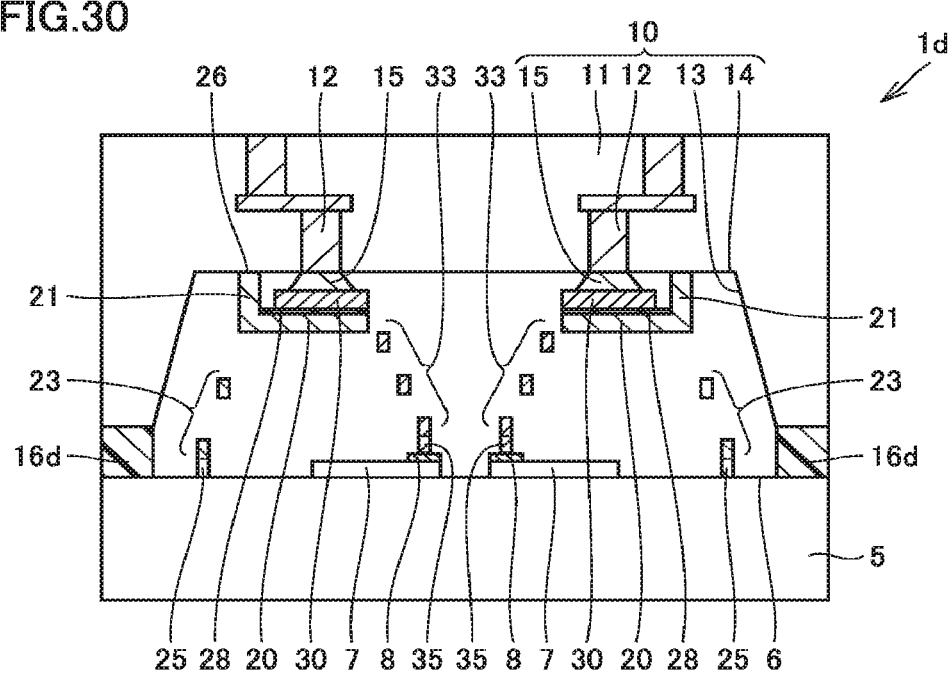
FIG. 30 is a schematic partial enlarged cross section of a semiconductor apparatus according to a fourth embodiment of the present invention.

With reference to FIG. 30, a semiconductor apparatus 1d according to a fourth embodiment will be described. Semiconductor apparatus 1d of the present embodiment basically has the same configuration as semiconductor apparatus 1 of the first embodiment, except mainly for the following point:

In semiconductor apparatus 1d of the present embodiment, second substrate 10 is bonded to first substrate 5 via a third bonding portion 16d that is a eutectic bonding portion or a bonding portion of an adhesive, solder or frit glass. Third bonding portion 16d in the present embodiment that is a eutectic bonding portion or a bonding portion of an adhesive, solder or frit glass is larger in thickness than third bonding portion 16 in the first embodiment that is an anodic bonding portion or a surface activated bonding portion. Third bonding portion 16d of the present embodiment may be larger in thickness than first pad 30.

A method for manufacturing semiconductor apparatus 1d of the present embodiment will be described. The method for manufacturing semiconductor apparatus 1d of the present embodiment comprises a process similar to that of the method for manufacturing semiconductor apparatus 1 of the first embodiment, except mainly for the following point:

In the method for manufacturing semiconductor apparatus 1d of the present embodiment, sealing semiconductor device 7 comprises bonding second substrate 10 to first substrate 5 by eutectic bonding or bonding using an adhesive, solder or frit glass. In other words, sealing semiconductor device 7 comprises bonding second substrate 10 to first substrate 5 via third bonding portion 16d that is a eutectic bonding portion or a bonding portion of an adhesive, solder or frit glass.

Bonding second substrate 10 to first substrate 5 by eutectic bonding for example has the following steps: A first metal layer composed of a first metal is formed on first surface 6 of first substrate 5. A second metal layer composed of a second metal is formed on second surface 14 of second substrate 10. Second substrate 10 is deposited on first substrate 5 to bring the second metal layer into contact with the first metal layer. By applying heat and pressure to first substrate 5 and second substrate 10, a eutectic alloy of the first metal and the second metal is formed between first substrate 5 and second substrate 10. Second substrate 10 is bonded to first substrate 5 by a eutectic bonding portion including the eutectic alloy, or third bonding portion 16d.

Bonding second substrate 10 to first substrate 5 by bonding using an adhesive, solder or frit glass for example has the following steps: An adhesive, solder or frit glass is applied to at least one of first substrate 5 and second substrate 10. Second substrate 10 is disposed on first substrate 5. Pressure is applied to first substrate 5 and second substrate 10. Heat may further be applied to first substrate 5 and second substrate 10. In this way, second substrate 10 is bonded to first substrate 5 by a bonding portion of an adhesive, solder or frit glass, or third bonding portion 16d.

An effect of semiconductor apparatus 1d of the present embodiment and a method for manufacturing the same will now be described. Semiconductor apparatus 1d of the present embodiment and the method for manufacturing the same basically have an effect similar to that of semiconductor apparatus 1 of the first embodiment and the method for manufacturing the same, except mainly for the following point:

Third bonding portion 16d in the present embodiment that is a eutectic bonding portion or a bonding portion of an adhesive, solder or frit glass is larger in thickness than third bonding portion 16 in the first embodiment that is an anodic bonding portion or a surface activated bonding portion. Accordingly, the distance between semiconductor device 7 and interconnect 12 in the present embodiment is larger than the distance between semiconductor device 7 and interconnect 12 in the first embodiment. In semiconductor apparatus 1d of the present embodiment, first pad 30 is electrically and mechanically connected to first flexible connecting member 33. The method for manufacturing semiconductor apparatus 1d of the present embodiment comprises forming first flexible connecting member 33 electrically connected to semiconductor device 7, and forming above first surface 6 of first substrate 5 first pad 30 electrically and mechanically connected to first flexible connecting member 33. According to semiconductor apparatus 1d according to the present embodiment and the method for manufacturing the same, even when the distance between semiconductor device 7 and interconnect 12 is changed, first pad 30 and interconnect 12 can be steadily, electrically connected and mechanically bonded to each other via bump 15.

In the semiconductor apparatus of a modification of the present embodiment and a method for manufacturing the same, instead of first bonding portion 26 that is an anodic bonding portion or a surface activated bonding portion, first bonding portion 26a composed of a material which adheres to supporting member 20 and second substrate 10 (see FIG. 15) may be used to bond supporting member 20 to second substrate 10.

Fifth Embodiment

Figure 31:
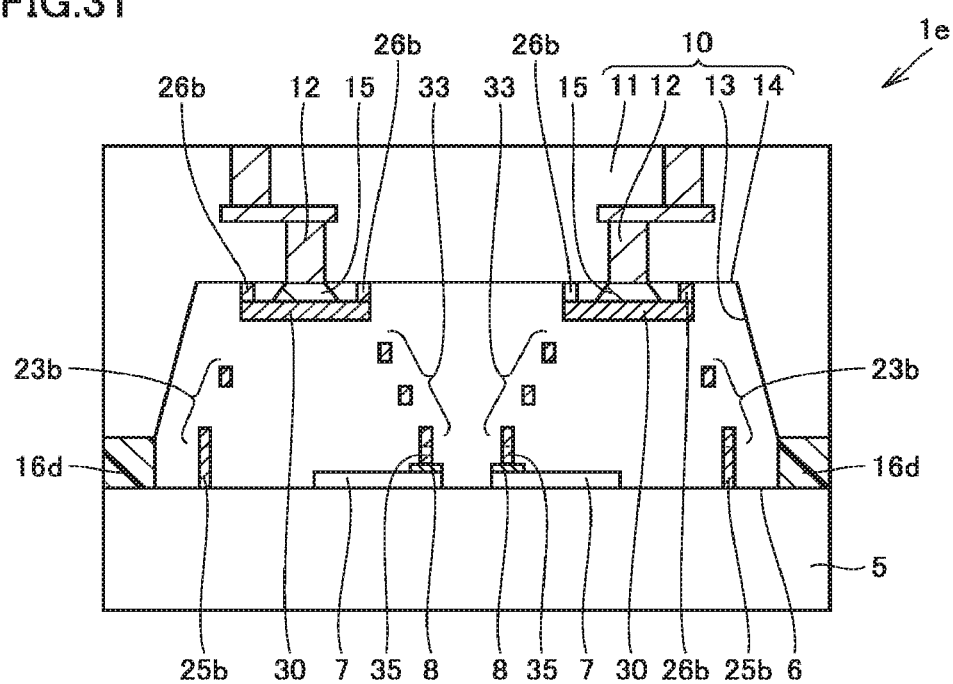
FIG. 31 is a schematic partial enlarged cross section of a semiconductor apparatus according to a fifth embodiment of the present invention.

With reference to FIG. 31, a semiconductor apparatus 1e according to a fifth embodiment will be described. Semiconductor apparatus 1e of the present embodiment basically has the same configuration as semiconductor apparatus 1b of the second embodiment, except mainly for the following point:

In semiconductor apparatus 1e of the present embodiment, second substrate 10 is bonded to first substrate 5 via third bonding portion 16d that is a eutectic bonding portion or a bonding portion of an adhesive, solder or frit glass. Third bonding portion 16d in the present embodiment that is a eutectic bonding portion or a bonding portion of an adhesive, solder or frit glass is larger in thickness than third bonding portion 16 in the second embodiment that is an anodic bonding portion or a surface activated bonding portion. Third bonding portion 16d in the present embodiment may be larger in thickness than first pad 30.

A method for manufacturing semiconductor apparatus 1e of the present embodiment will be described. The method for manufacturing semiconductor apparatus 1e of the present embodiment comprises a process similar to that of the method for manufacturing semiconductor apparatus 1b of the second embodiment, except mainly for the following point:

In the method for manufacturing semiconductor apparatus 1e of the present embodiment, sealing semiconductor device 7 comprises bonding second substrate 10 to first substrate 5 by eutectic bonding or bonding using an adhesive, solder or frit glass. In other words, sealing semiconductor device 7 comprises bonding second substrate 10 to first substrate 5 via third bonding portion 16d that is a eutectic bonding portion or a bonding portion of an adhesive, solder or frit glass.

An effect of semiconductor apparatus 1e of the present embodiment and a method for manufacturing the same will now be described. In addition to the effect of semiconductor apparatus 1b of the second embodiment and the method for manufacturing the same, semiconductor apparatus 1e according to the present embodiment and the method for manufacturing the same have the effect of semiconductor apparatus 1d of the fourth embodiment and the method for manufacturing the same.

In the semiconductor apparatus according to a modification of the present embodiment, and a method for manufacturing the same, rather than second bonding portion 26b composed of a material which adheres to first pad 30 and second substrate 10, second bonding portion 26c which is an anodic bonding portion or a surface activated bonding portion (see FIG. 25) may be used to bond first pad 30 to second substrate 10.

Sixth Embodiment

Figure 32:
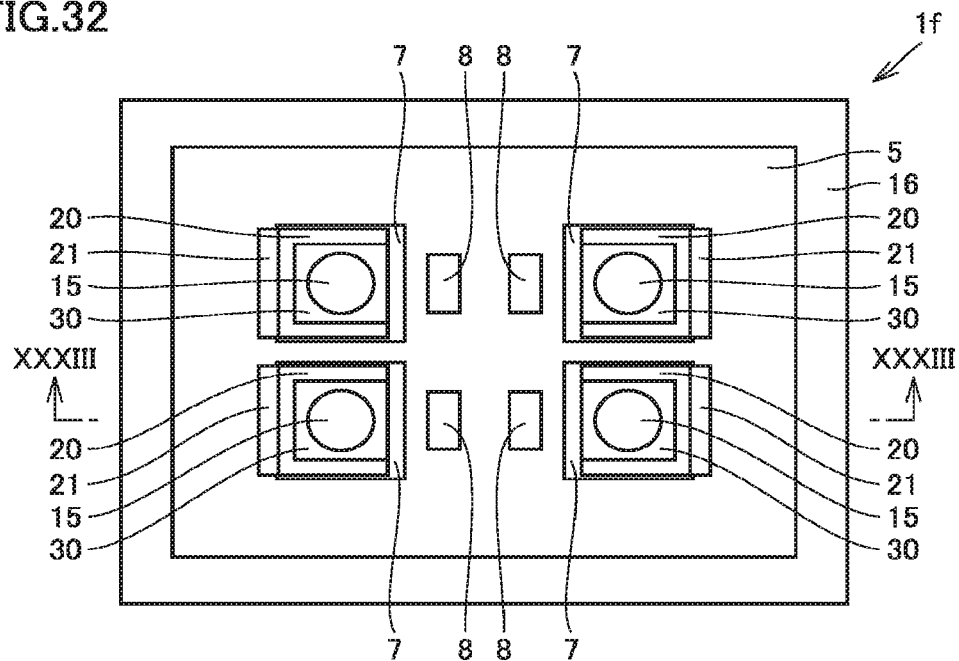
FIG. 32 is a schematic plan view of a semiconductor apparatus according to a sixth embodiment of the present invention.
Figure 33:
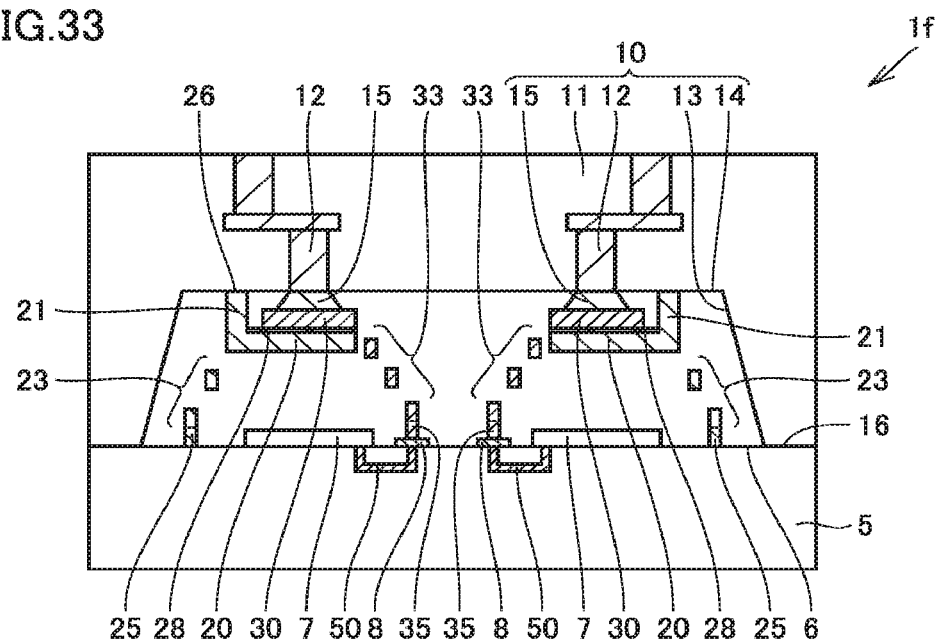
FIG. 33 is a schematic cross section of the semiconductor apparatus according to the sixth embodiment of the present invention, taken along a line XXXIII-XXXIII shown in FIG. 32.

With reference to FIGS. 32 and 33, a semiconductor apparatus 1f according to a sixth embodiment will be described. Semiconductor apparatus 1f of the present embodiment basically has the same configuration as semiconductor apparatus 1 of the first embodiment, except mainly for the following point:

In the present embodiment, semiconductor device 7 is a transistor. Specifically, semiconductor device 7 may be a power transistor. Semiconductor device 7 may be composed of a semiconductor material such as silicon (Si), gallium nitride (GaN) or silicon carbide (SiC).

First substrate 5 includes second pad 8 and an electrical connecting portion 50. Second pad 8 is disposed on first surface 6 away from semiconductor device 7. Electrical connecting portion 50 may be provided inside first substrate 5. Electrical connecting portion 50 may be provided on first surface 6 of first substrate 5. Second pad 8 is electrically connected to semiconductor device 7 via electrical connecting portion 50. Second pad 8 is electrically connected to first pad 30 via first flexible connecting member 33.

A method for manufacturing semiconductor apparatus 1f of the sixth embodiment will be described. The method for manufacturing semiconductor apparatus 1f of the present embodiment comprises a process similar to that of the method for manufacturing semiconductor apparatus 1 of the first embodiment, except mainly for the following point:

In the method for manufacturing semiconductor apparatus 1f of the present embodiment, first substrate 5 includes second pad 8 and electrical connecting portion 50. Providing semiconductor device 7 on and/or in first surface 6 of first substrate 5 comprises disposing semiconductor device 7 away from second pad 8. Second pad 8 is electrically connected to semiconductor device 7 via electrical connecting portion 50. First flexible connecting member 33 is electrically connected to second pad 8.

An effect of semiconductor apparatus 1f of the present embodiment and a method for manufacturing the same will now be described.

In addition to the effect of semiconductor apparatus 1 of the first embodiment, semiconductor apparatus 1f of the present embodiment has the following effect: In semiconductor apparatus 1f of the present embodiment, first substrate 5 includes second pad 8 and electrical connecting portion 50. Second pad 8 is disposed on first surface 6 away from semiconductor device 7. Second pad 8 is electrically connected to semiconductor device 7 via electrical connecting portion 50. Second pad 8 is electrically connected to first pad 30 via first flexible connecting member 33. In semiconductor apparatus 1f of the present embodiment, second pad 8 is disposed away from semiconductor device 7 and can thus be prevented from being damaged by heat generated from semiconductor device 7.

In addition to the effect of the method for manufacturing semiconductor apparatus 1 of the first embodiment, the method for manufacturing semiconductor apparatus 1f of the present embodiment has the following effect: In the method for manufacturing semiconductor apparatus 1f of the present embodiment, second pad 8 is disposed away from semiconductor device 7. Second pad 8 can thus be prevented from being damaged by heat generated from semiconductor device 7.

It should be understood that the first to sixth embodiments and the modifications thereof disclosed herein have been described for the purpose of illustration only and in a non-restrictive manner in any respect. Unless there is a contradiction, at least two of the first to sixth embodiments and the modifications thereof disclosed herein may be combined together. For example, in the first embodiment and a modification thereof, and the fourth embodiment, first pad 30 may be bonded to second surface 14 of second substrate 10 by using second bonding portion 26b of the second embodiment. The scope of the present invention is defined by the terms of the claims, rather than the description above, and is intended to include any modifications within the meaning and scope equivalent to the terms of the claims.

REFERENCE SIGNS LIST 1, 1a, 1b, 1c, 1d, 1e, 1f: semiconductor apparatus, 5: first substrate; 6: first surface; 7: semiconductor device; 8: second pad; 10: second substrate; 11: low-temperature co-fired ceramic (LTCC) substrate; 12: interconnect; 13: cavity; 14: second surface; 15: bump; 16, 16d: third bonding portion; 20: supporting member; 20s: second main surface; 21: protrusion; 22, 23, 24: second flexible connecting member; 22b, 23b, 24b: third flexible connecting member; 25: second fixing portion; 25b: third fixing portion; 26, 26a: first bonding portion; 26b, 26c: second bonding portion; 28, 28c: insulating layer; 30: first pad; 31: first main surface; 33: first flexible connecting member; 35: first fixing portion; 40, 40b: sacrificial layer; 41, 41b: first through hole; 42, 42b: second through hole; 45: power supply; 46: first charged layer; 47: second charged layer; 48: third charged layer; 50: electrical connecting portion.

The invention claimed is:
1. A semiconductor apparatus comprising:
a first substrate having a first surface;
a semiconductor device provided on and/or in the first surface;
a first flexible connecting member electrically connected to the semiconductor device;
a first pad electrically and mechanically connected to the first flexible connecting member; and
a second substrate having a second surface facing the first surface of the first substrate, and covering the semiconductor device,
the second substrate including a bump protruding from the second surface, and an interconnect electrically connected to the bump,
the second substrate being a low-temperature sintered ceramic substrate containing alkali metal ions,
the first pad being electrically connected and mechanically bonded to the interconnect via the bump,
the first pad having at least a portion overlapping the semiconductor device in a plan view seen in a direction along a normal to the first surface,
the bump having at least a portion overlapping the first pad in the plan view seen in the direction along the normal to the first surface.
2. The semiconductor apparatus according to claim 1, further comprising:

a second flexible connecting member mechanically connected to the first surface of the first substrate; and a supporting member supporting the first pad, wherein the supporting member is mechanically connected to the second flexible connecting member.

3. The semiconductor apparatus according to claim 2, comprising a first bonding portion bonding the supporting member to the second substrate.

4. The semiconductor apparatus according to claim 2, further comprising an insulating layer between the first pad and the supporting member.

5. The semiconductor apparatus according to claim 2, wherein
the supporting member has a protrusion protruding toward the second substrate, and
a height of the protrusion is larger than a thickness of the first pad.

6. The semiconductor apparatus according to claim 2, wherein
the first substrate includes a second pad and an electrical connecting portion,
the second pad is disposed on the first surface away from the semiconductor device,
the second pad is electrically connected to the semiconductor device via the electrical connecting portion, and
the second pad is electrically connected to the first pad via the first flexible connecting member.

7. The semiconductor apparatus according to claim 1, further comprising a third flexible connecting member mechanically connected to the first pad and the first surface of the first substrate.

8. The semiconductor apparatus according to claim 1, further comprising a second bonding portion bonding the first pad to the second substrate.

9. The semiconductor apparatus according to claim 1, wherein the semiconductor device is sealed by the first substrate and the second substrate.

10. The semiconductor apparatus according to claim 9, wherein the second substrate is bonded to the first substrate via an anodic bonding portion, a surface activated bonding portion, a eutectic bonding portion, or a bonding portion of an adhesive, solder or frit glass.

11. A method for manufacturing a semiconductor apparatus, comprising:
providing a semiconductor device on and/or in a first surface of a first substrate;
forming a first flexible connecting member electrically connected to the semiconductor device;
forming above the first surface of the first substrate a first pad electrically and mechanically connected to the first flexible connecting member, the forming the first pad including forming the first pad to have at least a portion overlapping the semiconductor device in a plan view seen in a direction along a normal to the first surface;
disposing a second substrate including a bump and an interconnect electrically connected to the bump so as to cover the semiconductor device, the disposing the second substrate including disposing the second substrate to allow a second surface of the second substrate with the bump protruding from the second surface to face the first surface of the first substrate and the bump to have at least a portion overlapping the first pad in the plan view seen in the direction along the normal to the first surface, the second substrate being a low-temperature sintered ceramic substrate containing alkali metal ions; and applying heat and a first voltage to the second substrate to move the first pad toward the second surface to electrically connect and mechanically bond the first pad to the interconnect via the bump.

12. The method for manufacturing a semiconductor apparatus according to claim 11, further comprising:
forming a second flexible connecting member mechanically connected to the first surface; and
forming above the first surface of the first substrate a supporting member mechanically connected to the second flexible connecting member, wherein
the forming the first pad includes forming the first pad on the supporting member, and
the moving the first pad toward the second surface includes applying a second voltage different from the first voltage to the supporting member to move the supporting member toward the second surface.

13. The method for manufacturing a semiconductor apparatus according to claim 12, further comprising applying the second voltage to the supporting member to bond the supporting member to the second substrate via a first bonding portion that is an anodic bonding portion.

14. The method for manufacturing a semiconductor apparatus according to claim 12, further comprising forming an insulating layer on the supporting member, wherein the forming the first pad includes forming the first pad on the insulating layer.

15. The method for manufacturing a semiconductor apparatus according to claim 12, further comprising forming on the supporting member a protrusion protruding away from the first surface, wherein a height of the protrusion is larger than a thickness of the first pad.

16. The method for manufacturing a semiconductor apparatus according to claim 11, further comprising forming a third flexible connecting member mechanically connected to the first pad and the first surface of the first substrate, wherein the moving the first pad toward the second surface includes applying a second voltage different in magnitude from the first voltage to the first pad.

17. The method for manufacturing a semiconductor apparatus according to claim 16, wherein
the third flexible connecting member is electrically connected to the first substrate, and
applying the second voltage to the first pad includes applying the second voltage to the first pad via the first substrate.

18. The method for manufacturing a semiconductor apparatus according to claim 11, further comprising sealing the semiconductor device by the first substrate and the second substrate.

19. The method for manufacturing a semiconductor apparatus according to claim 18, wherein sealing the semiconductor device includes bonding the second substrate to the first substrate by anodic bonding, surface activated bonding, eutectic bonding, or bonding using an adhesive, solder or frit glass.

20. The method for manufacturing a semiconductor apparatus according to claim 12, further comprising sealing the semiconductor device by the first substrate and the second substrate, wherein sealing the semiconductor device includes applying the second voltage and the first voltage to the first substrate and the second substrate, respectively, to anodically bond the second substrate to the first substrate.

* * * * *